(12) United States Patent
Tanaka et al.

(10) Patent No.: US 12,088,936 B2
(45) Date of Patent: Sep. 10, 2024

(54) SOLID-STATE IMAGING DEVICE, IMAGING METHOD, AND ELECTRONIC APPARATUS

(71) Applicant: SONY SEMICONDUCTOR SOLUTIONS CORPORATION, Kanagawa (JP)

(72) Inventors: Terukazu Tanaka, Kanagawa (JP); Atsumi Niwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/003,417

(22) PCT Filed: Jun. 28, 2021

(86) PCT No.: PCT/JP2021/024364
§ 371 (c)(1),
(2) Date: Dec. 27, 2022

(87) PCT Pub. No.: WO2022/009720
PCT Pub. Date: Jan. 13, 2022

(65) Prior Publication Data
US 2023/0247316 A1    Aug. 3, 2023

(30) Foreign Application Priority Data
Jul. 9, 2020  (JP) .................................. 2020-118774

(51) Int. Cl.
*H04N 25/57* (2023.01)
*H03G 3/30* (2006.01)
(Continued)

(52) U.S. Cl.
CPC .............. *H04N 25/57* (2023.01); *H03G 3/30* (2013.01); *H04N 25/51* (2023.01); *H04N 25/778* (2023.01); *H03G 2201/103* (2013.01)

(58) Field of Classification Search
None
See application file for complete search history.

(56) References Cited

U.S. PATENT DOCUMENTS

2018/0191972 A1   7/2018 Berner et al.

FOREIGN PATENT DOCUMENTS

| JP | 2020-008872 A | 1/2020 |
|---|---|---|
| JP | 2020-503752 A | 1/2020 |
| WO | 2019/087471 A1 | 5/2019 |

OTHER PUBLICATIONS

International Search Report and Written Opinion of PCT Application No. PCT/JP2021/024364, issued on Aug. 31, 2021, 08 pages of ISRWO.

*Primary Examiner* — Mark T Monk
(74) *Attorney, Agent, or Firm* — CHIP LAW GROUP

(57) ABSTRACT

An imaging device includes pixel circuit including a generation unit generating a voltage; a capacitor having a first electrode to which the voltage is applied; a first amplifier having a first input terminal, connected to a second electrode of the capacitor, and a second input terminal, to which a first reference voltage is applied to, to output a result by comparing the voltage with the first reference voltage; a switch unit controlling a connection between the output of the first amplifier and the first input terminal; and a second amplifier having a third input terminal, to which the output of the first amplifier is connected, and a fourth input terminal, to which a second reference voltage is applied, to output a result by comparing the voltage with the second reference voltage, in which a first gain of the first amplifier is lower than a second gain of the second amplifier.

15 Claims, 17 Drawing Sheets

(51) Int. Cl.
*H04N 25/51* (2023.01)
*H04N 25/778* (2023.01)

SOLID-STATE IMAGING DEVICE, IMAGING METHOD, AND ELECTRONIC APPARATUS

CROSS REFERENCE TO RELATED APPLICATIONS

This application is a U.S. National Phase of International Patent Application No PCT/JP2021/024364 filed on Jun. 28, 2021, which claims priority benefit of Japanese Patent Application No. JP 2020-118774 filed in the Japan Patent Office on Jul. 9, 2020. Each of the above-referenced applications is hereby incorporated herein by reference in its entirety.

FIELD

The present disclosure relates to a solid-state imaging device, an imaging method, and an electronic apparatus.

BACKGROUND

In a solid-state imaging device using a complementary metal oxide semiconductor (CMOS) or the like, an asynchronous solid-state imaging element has been known in which a detection circuit is provided for each pixel to detect that an amount of light received by the pixel has exceeded a threshold for each pixel address in real time as an address event. The solid-state imaging element detecting an address event for each pixel as described above is called a dynamic vision sensor (DVS).

As a configuration of such a DVS, it has been proposed that a photocurrent output from a photoelectric conversion element is converted into a logarithmic voltage signal, and this voltage signal is compared with a threshold by a comparator to detect an address event. According to this configuration, the contrast sensitivity of the DVS can be adjusted by controlling the threshold in the comparator.

CITATION LIST

Patent Literature

Patent Literature 1: US 2018/0191972 A

SUMMARY

Technical Problem

In the DVS, it may be desired to lower the contrast sensitivity, for example, in order to widen a dynamic range. As described above, the contrast sensitivity can be lowered by controlling the threshold for the comparator. However, when a gain of the comparator itself is high, a contrast sensitivity control range is limited to a voltage range within which the threshold can be set.

An object of the present disclosure is to provide a solid-state imaging element, an imaging method, and an electronic apparatus capable of capturing an image in a wider dynamic range.

Solution to Problem

For solving the problem described above, a solid-state imaging device according to one aspect of the present disclosure has pixel circuits, each of the pixel circuits including: a generation unit generating a voltage corresponding to a logarithmic value of a photocurrent; a capacitor having a first electrode to which the voltage generated by the generation unit is applied; a first amplifier having a first input terminal, which is connected to a second electrode of the capacitor, and a second input terminal, to which a first reference voltage is applied to, to output a comparison result obtained by comparing the voltage applied to the first input terminal with the voltage applied to the second input terminal; a switch unit controlling a connection between the output of the first amplifier and the first input terminal; and a second amplifier having a third input terminal, to which the output of the first amplifier is connected, and a fourth input terminal, to which a second reference voltage is applied, to output a comparison result obtained by comparing the voltage applied to the third input terminal with the voltage applied to the fourth input terminal, wherein a first gain of the first amplifier is lower than a second gain of the second amplifier.

DESCRIPTION OF EMBODIMENTS

Hereinafter, embodiments of the present disclosure will be described in detail with reference to the drawings. Note that, in the following embodiments, the same parts are denoted by the same reference signs, and redundant description will be omitted.

Hereinafter, embodiments of the present disclosure will be described in the following order.

1. Technology Applicable to Each Embodiment
2. Outline of Embodiment According to Present Disclosure
3. First Embodiment
3-1. First Modification of First Embodiment
3-2. Second Modification of First Embodiment
3-3. Third Modification of First Embodiment
4. Second Embodiment
4-1. Modification of Second Embodiment
5. Third Embodiment
6. Fourth Embodiment
7. Fifth Embodiment
7-1. Example of Application of Technology According to Present Disclosure
7-2. Example of Application to Mobile Body

1. Technology Applicable to Each Embodiment

Figure 1:
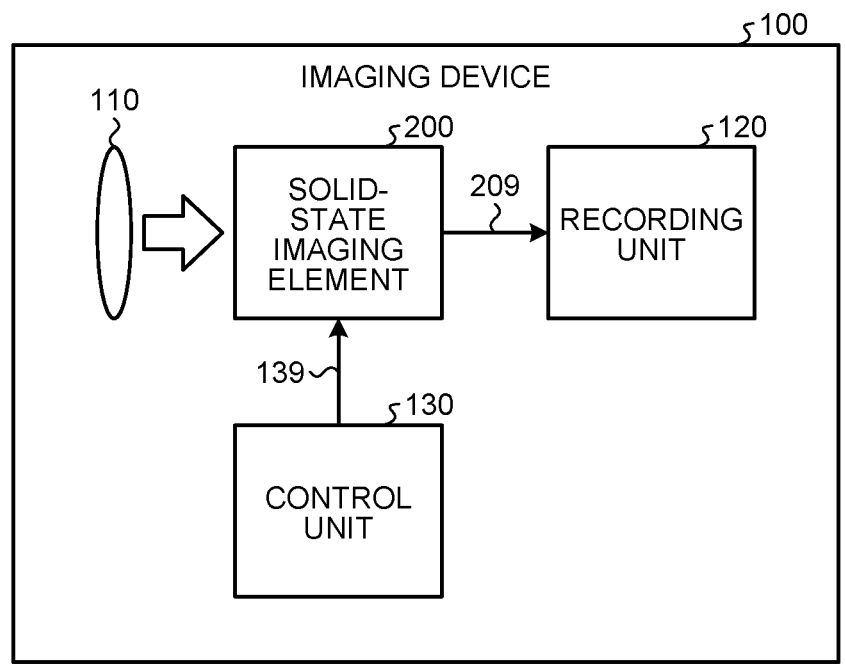
FIG. 1 is a block diagram illustrating a configuration of an example of an imaging device as an electronic apparatus applicable to each embodiment.

First, a technology applicable to each embodiment of the present disclosure will be described. FIG. 1 is a block diagram illustrating a configuration of an example of an imaging device as an electronic apparatus applicable to each embodiment. In FIG. 1, an imaging device 100 includes an optical unit 110, a solid-state imaging element 200, a recording unit 120, and a control unit 130. As the imaging device 100, a camera mounted on an industrial robot, an in-vehicle camera, or the like is assumed.

The optical unit 110 condenses incident light and guides the light to the solid-state imaging element 200. The solid-state imaging element 200 performs an imaging operation of photoelectrically converting the incident light and outputting a pixel signal. The solid-state imaging element 200 generates output data by performing predetermined signal processing such as image recognition processing on the basis of the pixel signal corresponding to the incident light, and supplies the generated output data to the recording unit 120 via a signal line 209.

The recording unit 120 records the output data supplied from the solid-state imaging element 200. The control unit 130 controls, for example, an imaging operation of the solid-state imaging element 200 and a recording operation of the recording unit 120 according to a predetermined program.

Figure 2:
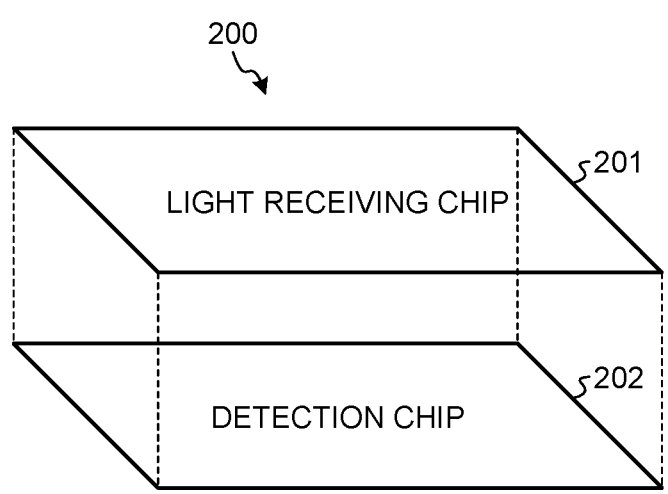
FIG. 2 is a schematic diagram illustrating an example of a structure of a solid-state imaging element applicable to each embodiment.

FIG. 2 is a schematic diagram illustrating an example of a structure of the solid-state imaging element 200 applicable to each embodiment. As schematically illustrated in FIG. 2, the solid-state imaging element 200 has a stack structure including a detection chip 202 and a light receiving chip 201 stacked on the detection chip 202. The light receiving chip 201 and the detection chip 202 are electrically connected to each other through a connection part such as a via. The method of connecting the light receiving chip 201 and the detection chip 202 to each other is not limited to the via, and Cu—Cu bonding or a bump can also be applied.

Figure 3:
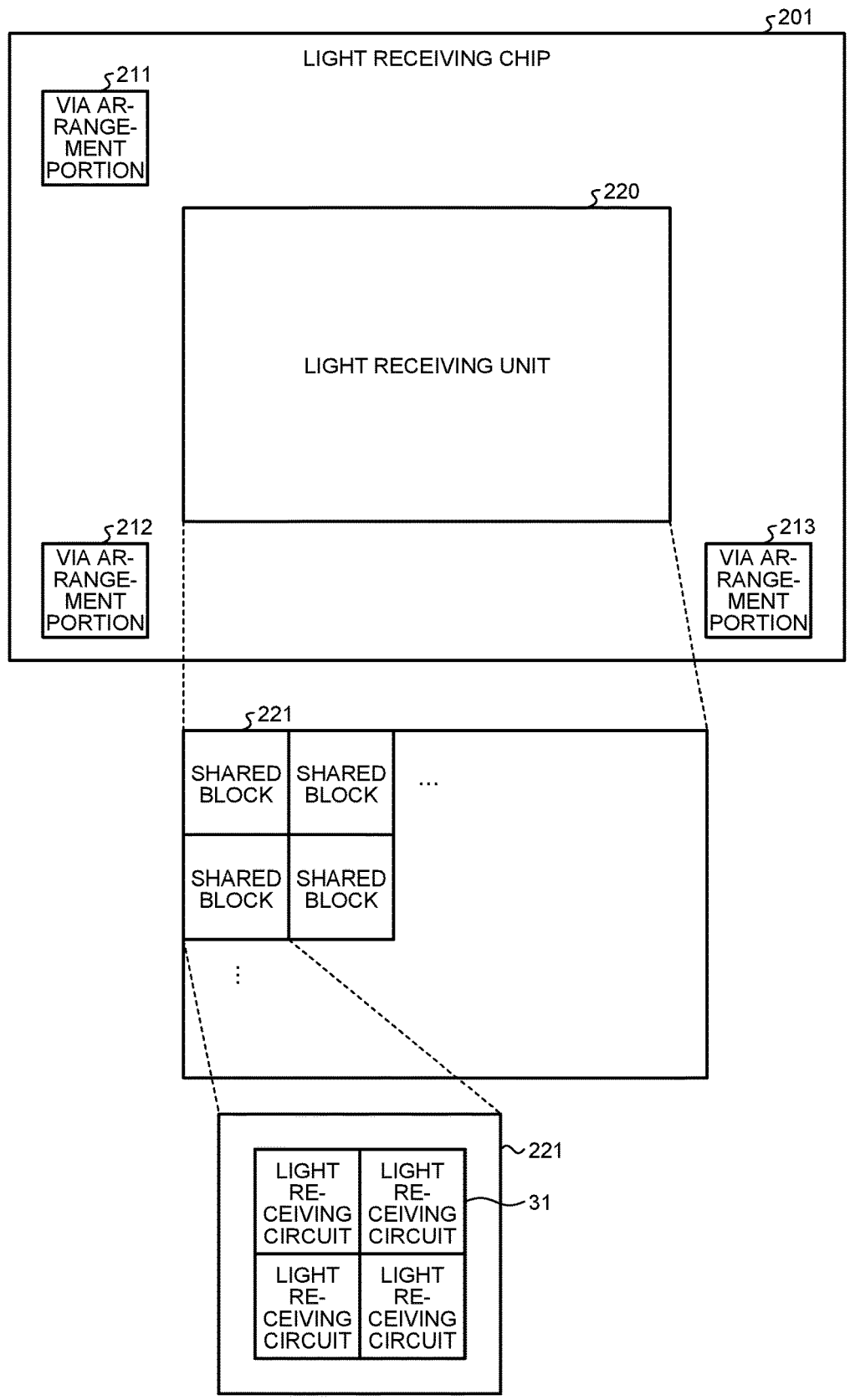
FIG. 3 is a plan view of an example of a light receiving chip applicable to each embodiment.

FIG. 3 is a plan view of an example of the light receiving chip 201 applicable to each embodiment. The light receiving chip 201 includes a light receiving unit 220 and via arrangement portions 211, 212, and 213.

In the via arrangement portions 211, 212, and 213, vias connected to the detection chip 202 are arranged. Furthermore, in the light receiving unit 220, a plurality of shared blocks 221 are arranged in a matrix array.

In each of the shared blocks 221, a plurality of light receiving circuits 31 is arranged in a matrix form. In the example of FIG. 3, four light receiving circuits 31 are arranged in 2 rows×2 columns for each shared block 221. These four light receiving circuits 31 share a circuit on the detection chip 202. The shared circuit will be described in detail below. Note that the number of light receiving circuits 31 in the shared block 221 is not limited to four. For example, two or three light receiving circuits 31 may be arranged in the shared block 221, or five or more light receiving circuits 31 may be arranged in the shared block 221. Furthermore, only one light receiving circuit 31 may be arranged in the shared block 221.

The light receiving circuit 31 includes a photoelectric conversion element, a logarithmic response circuit that generates a voltage signal according to a logarithmic value of a photocurrent output from the photoelectric conversion element by a logarithmic response, and a detection circuit that detects a change amount of the voltage signal generated by the logarithmic response circuit. A pixel address including a row address and a column address is assigned to each of the light receiving circuits 31.

Figure 4:
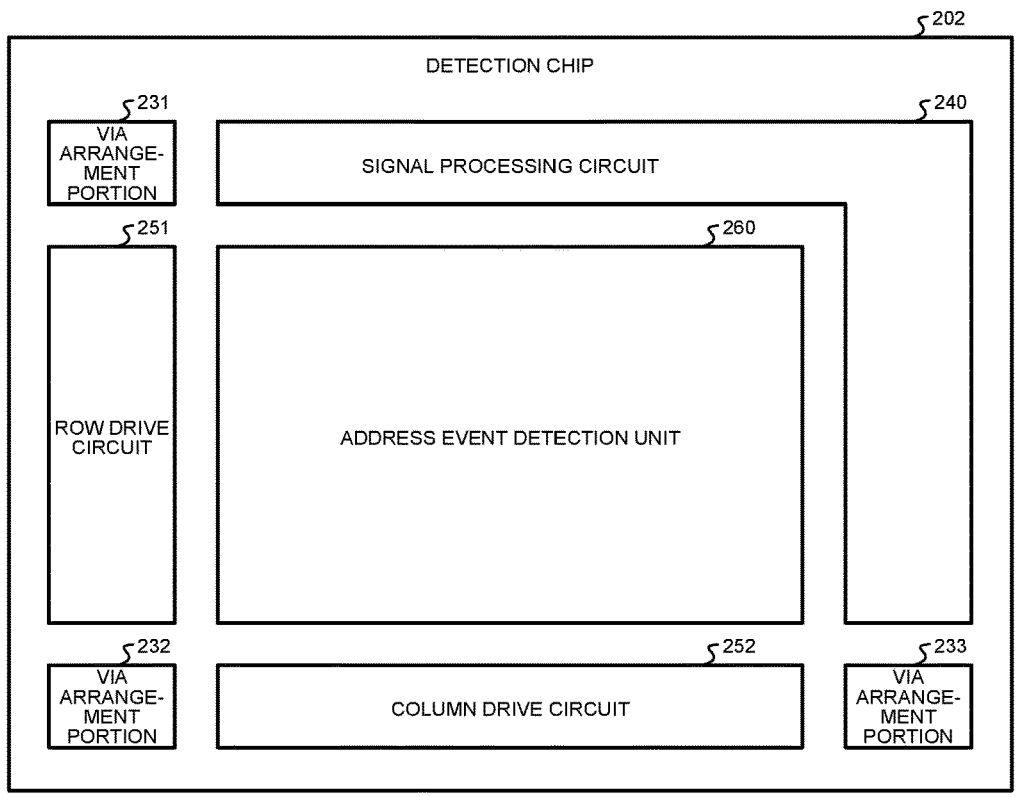
FIG. 4 is a plan view of an example of a detection chip applicable to each embodiment.

FIG. 4 is a plan view of an example of the detection chip 202 applicable to each embodiment. In the example of FIG. 4, the detection chip 202 includes via arrangement portions 231, 232, and 233, a signal processing circuit 240, a row drive circuit 251, a column drive circuit 252, and an address event detection unit 260. In the via arrangement portions 231, 232, and 233, the vias connected to the via arrangement portions 211, 212, and 213 of the light receiving chip 201 are arranged.

The address event detection unit 260 detects whether or not there is an address event for each light receiving circuit 31, and generates a detection signal indicating a detection result.

The row drive circuit 251 selects a row address, and causes the address event detection unit 260 to output a detection signal corresponding to the row address. The column drive circuit 252 selects a column address, and causes the address event detection unit 260 to output a detection signal corresponding to the column address.

The signal processing circuit 240 performs predetermined signal processing on the detection signal from the address event detection unit 260. The signal processing circuit 240 arranges detection signals as pixel signals in a two-dimensional lattice array, that is, in a matrix array, and acquires image data having two-bit information for each pixel. Then, the signal processing circuit 240 executes signal processing, such as image recognition processing, on the image data.

Figure 5:
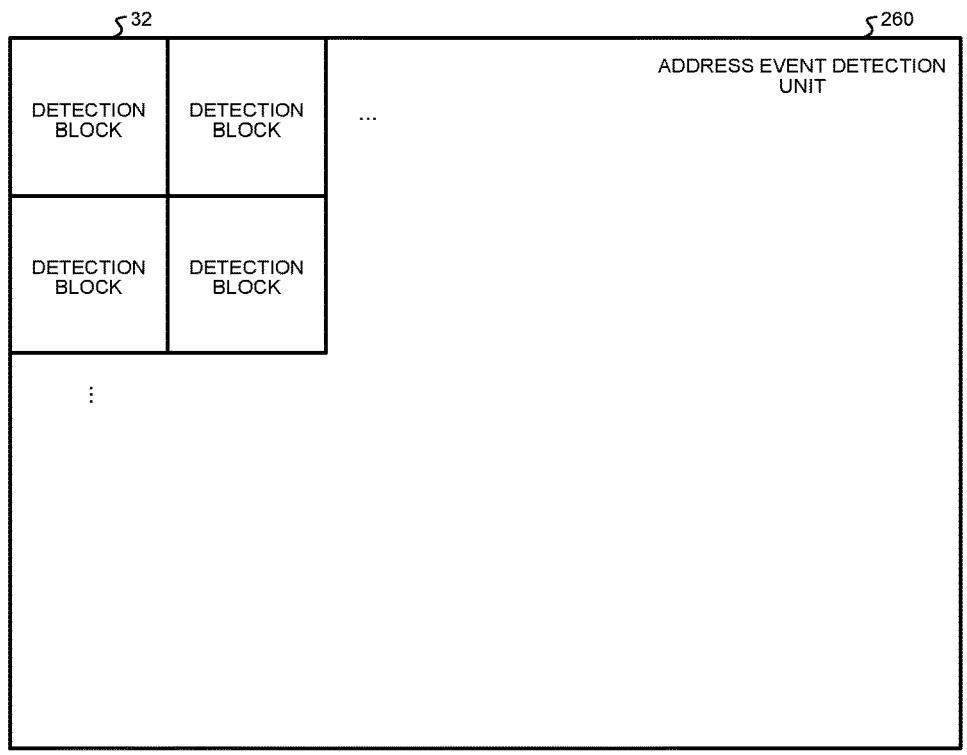
FIG. 5 is a plan view of an example of an address event detection unit applicable to each embodiment.

FIG. 5 is a plan view of an example of the address event detection unit 260 applicable to each embodiment. In FIG. 5, in the address event detection unit 260, a plurality of detection blocks 32 are arranged. The detection block 32 is arranged for each shared block 221 on the light receiving chip 201. In a case where the number of the shared blocks 221 is N (N is an integer), N detection blocks 32 are arranged. Each of the detection blocks 32 is connected to a corresponding one of the shared blocks 221.

Figure 6:
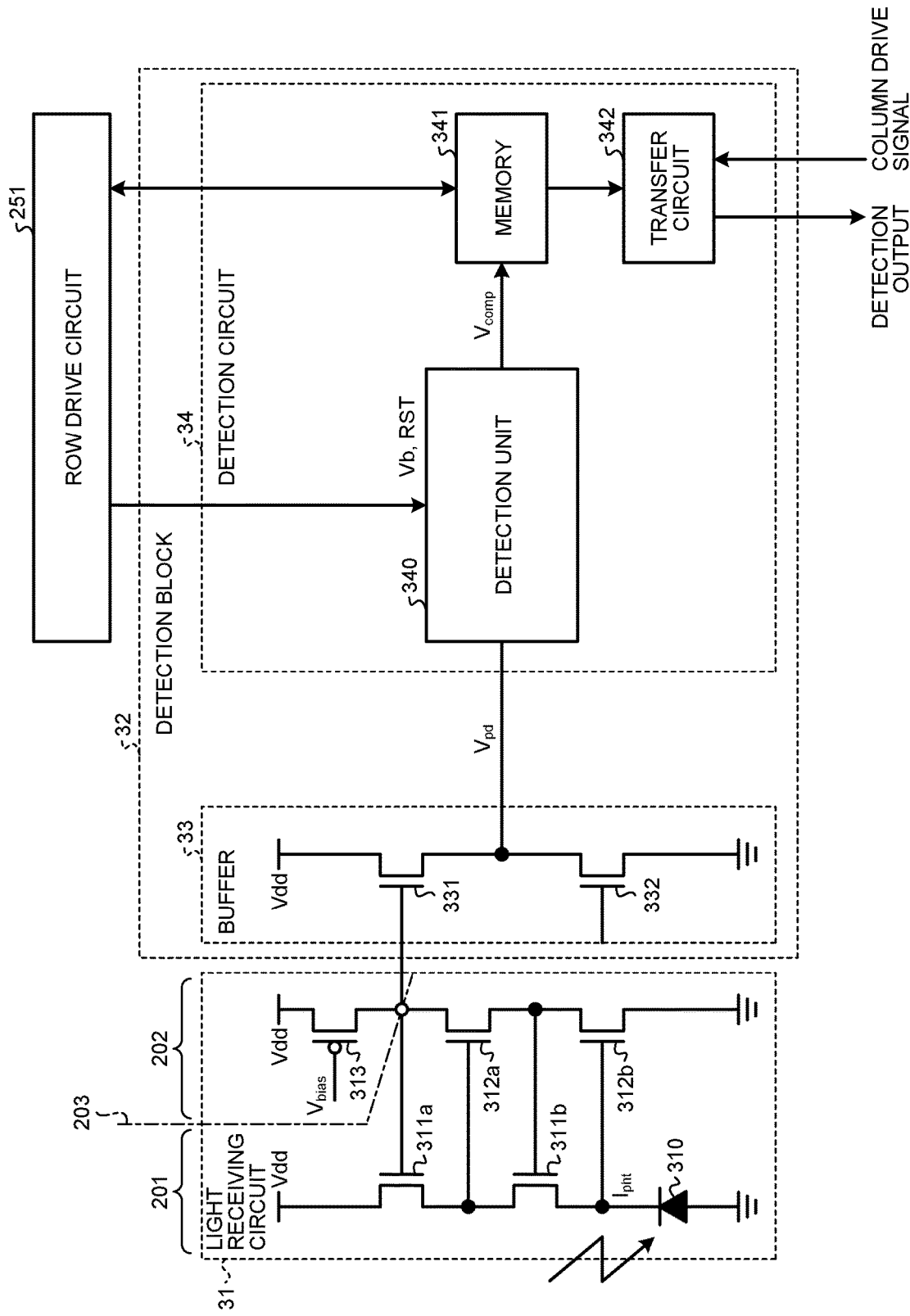
FIG. 6 is a diagram illustrating a configuration of an example of each of a light receiving circuit and a detection block applicable to each embodiment.

FIG. 6 is a diagram illustrating a configuration of an example of each of the light receiving circuit 31 and the detection block 32 applicable to each embodiment. An output of the light receiving circuit 31 is supplied to the detection block 32. The detection block 32 includes a buffer 33 and a detection circuit 34.

In FIG. 6, the light receiving circuit 31 includes a photoelectric conversion element 310, transistors 311a, 311b, 312a, and 312b which are n-channel metal oxide semiconductor (nMOS) transistors, and a transistor 313 which is a p-channel MOS (pMOS) transistor. Among them, for example, the photoelectric conversion element 310 and the transistors 311a, 311b, 312a, and 312b are arranged in the light receiving chip 201, and the transistor 313 is arranged in the detection chip 202.

The photoelectric conversion element 310 outputs a photocurrent $I_{pht}$ corresponding to the received light.

A source of the transistor 311b is connected to a cathode of the photoelectric conversion element 310, and a drain of the transistor 311b is connected to a source of the transistor 311a. A drain of the transistor 311a is connected to a power supply terminal Vdd. An anode of the photoelectric conversion element 311 is connected to a ground terminal.

A gate of the transistor 312b is connected to a connection point between the cathode of the photoelectric conversion element 310 and the drain of the transistor 311b. A source of the transistor 312b is connected to the ground terminal, and a drain of the transistor 312b is connected to a source of the transistor 312a. A gate of the transistor 311b is connected to a connection point between the drain of the transistor 312b and the source of the transistor 312a. A drain of the transistor 312a is connected to a source of the transistor 313. A drain of the transistor 313 is connected to the power supply terminal Vdd, and a predetermined bias voltage $V_{bias}$ is applied to a gate of the transistor 313. A gate of the transistor 311a is connected to a connection point between the drain of the transistor 312a and the source of the transistor 313.

Each of the drains of the transistors 311b and 312b is connected to the power supply side, and forms a source follower circuit. The two source follower circuits formed by the transistors 311b and 312b are connected to each other in a loop shape. Similarly, each of the drains of the transistors 311a and 312a is connected to the power supply side to form a source follower circuit, and the two source follower circuits formed by the transistors 311a and 312a are connected to each other in a loop shape. That is, the light receiving circuit 31 illustrated in FIG. 6 has a configuration in which circuits each including two source follower circuits connected to each other in a loop shape are connected to each other in series.

By virtue of the configuration in which circuits each including two source follower circuits connected to each other in a loop shape are connected to each other in series, the photocurrent $I_{pht}$ output from the photoelectric conversion element 310 is converted into a voltage signal corresponding to a logarithmic value thereof. In addition, the transistor 313 supplies a constant current to the transistors 312a and 312b. In this manner, the light receiving circuit 31 functions as a generation unit that generates a voltage corresponding to a logarithmic value of a photocurrent.

Note that the ground of the light receiving chip 201 and the ground of the detection chip 202 are separated from each other as a countermeasure against interference.

In the light receiving circuit 31, the voltage signal obtained by converting the photocurrent $I_{pht}$ according to the logarithmic value thereof is extracted from the connection point between the source of the transistor 313 and the drain of the transistor 312a, and is input to the detection circuit 34 as a voltage signal $V_{pd}$ via the buffer 33 including transistors 331 and 332 that are nMOS transistors.

The detection circuit 34 includes a detection unit 340a, a memory 341, and a transfer circuit 342. For example, in the example of FIG. 6, a reset signal RST and a threshold voltage Vb are supplied the detection unit 340a from the row drive circuit 251. The detection unit 340a performs determination processing on the voltage signal $V_{pd}$ input from the light receiving circuit 31 via the buffer 33 on the basis of a threshold Vth, and outputs a signal $V_{comp}$ indicating a change in amount of received light in the photoelectric conversion element 310. The signal $V_{comp}$ includes a signal $V_{ON}$ indicating a change in amount of received light in a positive (+) direction or a signal $V_{OFF}$ indicating a change in amount of received light in a negative (−) direction, and indicates an occurrence of an address event.

Figure 7:
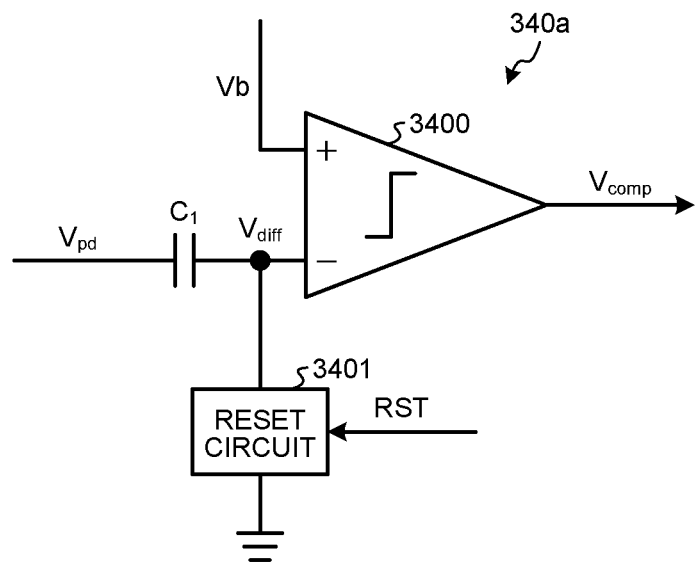
FIG. 7 is a diagram illustrating an example of a configuration of a detection unit according to the conventional technology.

FIG. 7 is a diagram illustrating an example of a configuration of the detection unit 340a according to the conventional technology. Here, a configuration illustrated in FIG. 1 of Patent Literature 1 is applied as the configuration of the detection unit 340a according to the conventional technology. In FIG. 7, the detection unit 340aa includes a capacitor $C_1$, a comparator 3400, and a reset circuit 3401.

The voltage signal $V_{pd}$ is supplied to a first electrode of the capacitor $C_1$, such that an electric charge generated according to light received by the photoelectric conversion element 310 is supplied to the capacitor $C_1$. A second electrode of the capacitor $C_1$ is connected to an inverting input terminal (−) of the comparator 3400. A signal input to the inverting input terminal (−) of the comparator 3400 is a signal $V_{diff}$ that changes as the voltage signal $V_{pd}$ input to the first electrode of the capacitor $C_1$ changes.

The threshold voltage Vb supplied from the row drive circuit 251 is input to a non-inverting input terminal (+) of the comparator 3400.

The signal $V_{comp}$ output from the comparator 3400 is supplied to and stored in the memory 341. The memory 341 is constituted by a sampling circuit. The sampling circuit can be realized, for example, by using a switch and a capacitor. The memory 341 is not limited thereto, and may be configured as a memory circuit such as a latch circuit or a flip-flop circuit.

The reset circuit 3401 is connected to a connection point between the second electrode of the capacitor $C_1$ and the inverting input terminal (−) of the comparator 3400. The reset signal RST is supplied to the reset circuit 3401 from the row drive circuit 251. The reset signal RST is a signal for selecting a time at which the reset circuit 3401 is to be activated. The row drive circuit 251 outputs a reset signal RST according to the signal $V_{comp}$ stored in the memory 341.

The reset circuit 3401 is activated by the reset signal RST to reset a state of the second electrode of the capacitor $C_1$. Therefore, in the second electrode of the capacitor $C_1$, a signal $V_{diff}$ of a difference between a current voltage signal $V_{pd}$ and a past voltage signal $V_{pd}$ appears. The comparator 3400 compares the voltage of the signal $V_{diff}$ with the threshold voltage Vb, and outputs a signal $V_{comp}$ as a comparison result.

Returning to FIG. 6, the transfer circuit 342 reads a signal $V_{comp}$ from the memory 341 according to a column drive signal supplied from the column drive circuit 252, for example, under the control of the control unit 130, and outputs the read signal $V_{comp}$ from the detection block 32 as a detection output indicating a result of detection by the detection block 32 as to an address event. This detection output is supplied, for example, to the signal processing circuit 240. The signal processing circuit 240 performs predetermined signal processing such as image recognition processing on the basis of the detection output supplied from the detection block 32. The detection output subjected to the predetermined signal processing by the signal processing circuit 240 is recorded, for example, in the recording unit 120. Alternatively, the detection output from the detection block 32 may be directly recorded in the recording unit 120.

The operation of the comparator 3400 according to the conventional technology will be described in more detail. The comparator 3400 detects an event in which the amount of light received by the photoelectric conversion element 310 increases and an event in which the amount of light received by the photoelectric conversion element 310 decreases. Hereinafter, the event in which the light amount increases will be referred to as a (+) event, and the event in which the light amount decreases will be referred to as a (−) event.

In a case where a (−) event is detected, the row drive circuit 251 outputs a threshold voltage Vb which is a voltage $V_{OFF}$, for example, under the control of the control unit 130, and supplies the threshold voltage Vb to the comparator 3400. On the other hand, in a case where a (+) event is detected, the row drive circuit 251 outputs a threshold voltage Vb which is a voltage $V_{ON}$ lower than the voltage $V_{OFF}$, for example, under the control of the control unit 130, and supplies the threshold voltage Vb to the comparator 3400. The row drive circuit 251 repeatedly outputs, for example, a voltage $V_{OFF}$, a voltage $V_{ON}$, and a voltage Vreset in time series as the threshold voltage Vb. Note that the voltage Vreset is, for example, an intermediate voltage value between the voltage $V_{OFF}$ and the voltage $V_{ON}$.

In a case where a (−) event is detected, when a voltage of a signal $V_{diff}$ is lower than a threshold voltage Vb which is a voltage $V_{OFF}$, the comparator 3400 outputs a high-level signal $V_{comp}$, and the signal $V_{comp}$ is stored in the memory 341. This indicates that a (−) event, that is, a decrease in light amount, has been detected. When the voltage of the signal $V_{diff}$ is equal to or higher than the threshold voltage Vb (voltage $V_{OFF}$), the comparator 3400 outputs a low-level signal $V_{comp}$, which indicates that a decrease in light amount has not been detected.

On the other hand, in a case where a (+) event is detected, when a voltage of a signal $V_{diff}$ is higher than a threshold voltage Vb which is a voltage $V_{ON}$, the comparator 3400 outputs a low-level signal $V_{comp}$, and the signal $V_{comp}$ is stored in the memory 341. This indicates that a (+) event, that is, an increase in light amount, has been detected. When the voltage of the signal $V_{diff}$ is equal to or lower than the threshold voltage Vb (voltage $V_{ON}$), the comparator 3400 outputs a high-level signal $V_{comp}$, which indicates that an increase in light amount has not been detected.

Therefore, when a signal $V_{comp}$ is read from the memory 341, it is necessary to know a content of the memory 341 and which one of voltages $V_{OFF}$ and $V_{ON}$ is applied as the threshold voltage Vb. For example, the control unit 130 acquires a content of the memory 341 via the row drive circuit 251, and instructs the column drive circuit 252 to read a signal $V_{comp}$ from the memory 341 on the basis of the acquired content of the memory 341 and the threshold voltage Vb.

The operations of the light receiving circuit 31 and the detection block 32 according to the conventional technology will be described in more detail. A change in amount of light received by the photoelectric conversion element 310 is converted into a change in voltage signal $V_{pd}$ by a logarithmic conversion circuit included in the light receiving circuit 31. In a case where the reset circuit 3401 is not active and is not conductive, a change in voltage signal $V_{pd}$ is reflected in a signal $V_{diff}$ input to the inverting input terminal (−) of the comparator 3400 via the capacitor $C_1$. This is because a voltage across the capacitor $C_1$ remains at a constant voltage.

When selected by the row drive circuit 251, the comparator 3400 compares a voltage of a signal $V_{diff}$ input to the inverting input terminal (−) and a threshold voltage Vb applied to the non-inverting input terminal (+) in the second electrode of the capacitor $C_1$. The comparator 3400 outputs a signal $V_{comp}$ as a comparison result. The signal $V_{comp}$ output from the comparator 3400 is stored in the memory 341, for example, by the row drive circuit 251.

When it is determined that the signal $V_{comp}$ stored in the memory 341 indicates that the amount of light received by the photoelectric conversion element 310 has been changed on the basis of the stored content of the memory 341 and the threshold voltage Vb, and the reset signal RST is active, the row drive circuit 251 makes the reset circuit 3401 conductive. When the reset circuit 3401 becomes a conductive state, the voltage of the signal $V_{diff}$ at the inverting input terminal (−) of the comparator 3400 is reset to a known level. Therefore, a current voltage signal $V_{pd}$ is stored in the capacitor $C_1$.

2. Overview of Embodiment According to Present Disclosure

Next, an outline of an embodiment of the present disclosure will be described. In the configuration according to the conventional technology described above, it may be desired to lower contrast sensitivity, for example, in order to widen a dynamic range of a DVS. In this case, the contrast sensitivity can be lowered by controlling the threshold voltage Vb applied to the comparator 3400. However, when a gain of the comparator 3400 itself is high, a contrast sensitivity control range is limited to a voltage range within which the threshold voltage Vb can be set.

Therefore, in the embodiment according to the present disclosure, two-stage comparators are connected to each other in the DVS circuit, and a gain of an input-side comparator is set to be lower than a gain of an output-side comparator. As a result, it is possible to widen a range of a voltage signal $V_{pd}$ that can be input to the input-side comparator, thereby reducing the contrast of the DVS circuit.

3. First Embodiment

Figure 8A:
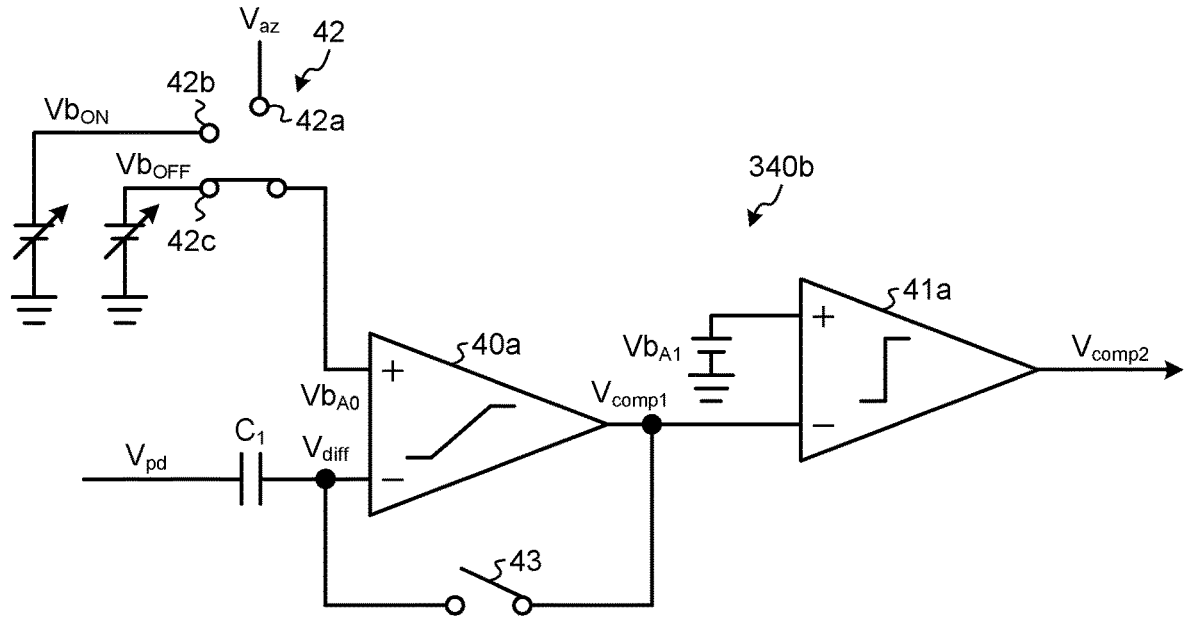
FIG. 8A is a diagram illustrating an example of a configuration of a detection unit according to a first embodiment.

Next, a first embodiment of the present disclosure will be described. FIG. 8A is a diagram illustrating an example of a configuration of a detection unit 340b according to the first embodiment. In FIG. 8A, the detection unit 340b includes a capacitor $C_1$, comparators 40a and 41a connected to each other in series, each having a configuration as an amplifier, and switch circuits 42 and 43.

A voltage signal $V_{pd}$ output from the light receiving circuit 31 is applied to a first electrode of the capacitor $C_1$ via the buffer 33, and a signal $V_{diff}$ is input from a second electrode of the capacitor $C_1$ to an inverting input terminal (−) which is a first input terminal of the comparator 40a as a first amplifier which is an input-side amplifier. A selection output terminal of the switch circuit 42 is connected to a non-inverting input terminal (+) which is a second input terminal of the comparator 40a.

In the example of FIG. 8A, the switch circuit 42 includes three selection input terminals 42a, 42b, and 42c. Voltages $V_{az}$, $Vb_{on}$, and $Vb_{off}$ are applied to the selection input terminals 42a, 42b, and 42c, respectively. The voltage $Vb_{on}$ is a threshold for determining a (+) event. The voltage $Vb_{off}$ is a threshold for determining an (−) event. In addition, the voltage $V_{az}$ is, for example, an intermediate voltage between the voltage $Vb_{on}$ and the voltage $Vb_{off}$, and is a reset level voltage for resetting an event detected immediately before.

In the switch circuit 42, for example, any one of the selection input terminals 42a, 42b, and 42c is selected according to a control signal (not illustrated) from the row drive circuit 251, and the voltage applied to the selected input terminal is applied to the non-inverting input terminal (+) of the comparator 40a as a threshold voltage $Vb_{A0}$ which is a first reference voltage signal.

For example, in a case where the voltage $Vb_{on}$ is selected as the threshold voltage $Vb_{A00}$, a (+) event is detected when a voltage of a signal $V_{diff}$ applied to the inverting input terminal (−) of the comparator 40a is higher than the voltage $Vb_{on}$ in a direction from the voltage $V_{az}$ to the voltage $Vb_{on}$. In addition, in a case where the voltage $Vb_{off}$ is selected as the threshold voltage $Vb_{A0}$, a (−) event is detected when the voltage of the signal $V_{diff}$ is higher than the voltage $Vb_{off}$ in a direction from the voltage $V_{az}$ to the voltage $Vb_{off}$. On the other hand, when the voltage of the signal $V_{diff}$ is not higher than the voltage $Vb_{on}$ in the direction from the voltage $V_{az}$ to the voltage $Vb_{on}$ and is not higher than the voltage $Vb_{off}$ in the direction from the voltage $V_{az}$ to the voltage $Vb_{off}$, neither a (+) event nor a (−) event is detected.

Hereinafter, unless otherwise specified, "the voltage of the signal $V_{diff}$ is higher than the voltage $Vb_{on}$ in the direction from the voltage $V_{az}$ to the voltage $Vb_{on}$" will be described as "the voltage of the signal $V_{diff}$ is higher than the voltage $Vb_{on}$", and similarly, "the voltage of the signal $V_{diff}$ is higher than the voltage $Vb_{off}$ in the direction from the voltage $V_{az}$ to the voltage $Vb_{off}$" will be described as "the voltage of the signal $V_{diff}$ is higher than the voltage $Vb_{off}$". In addition, "the voltage of the signal $V_{diff}$ is higher than the voltage $Vb_{on}$" and "the voltage of the signal $V_{diff}$ is higher than the voltage $Vb_{off}$" may be collectively referred to as "the voltage of the signal $V_{diff}$ is higher than the threshold voltage $Vb_{A0}$".

In the first embodiment, the voltages $Vb_{on}$ and $Vb_{off}$ have variable voltage values. For example, the larger the absolute value of the difference between the voltage values of the voltage $Vb_{on}$ or $Vb_{off}$ and the voltage $V_{az}$, the lower the sensitivity (contrast sensitivity) in detecting a change in light amount. That is, this corresponds to decreasing the gain of the comparator 40a. In this manner, the voltage $Vb_{on}$ or $Vb_{off}$ functions as a gain change unit that changes the gain of the comparator 40a.

As an example, for use in an environment with a larger amount of light, it may be considered to switch voltage values of the voltages $Vb_{on}$ and $Vb_{off}$ to increase the absolute value of the difference from the voltage $V_{az}$.

In the switch circuit 42, the output performed by selecting any one of the voltages $Vb_{on}$, $Vb_{off}$, and $V_{az}$ is applied as the threshold voltage $Vb_{A00}$ to the inverting input terminal (−) of the comparator 40a. The comparator 40a compares the voltage of the signal $V_{diff}$ input to the inverting input terminal (−) with the threshold voltage $Vb_{A0}$ applied to the non-inverting input terminal (+), and outputs a signal $V_{comp1}$ as a comparison result.

An output terminal of the comparator 40a is connected to an inverting input terminal (−) as a third input terminal of the comparator 41a as a second amplifier which is an output-side amplifier, and is also connected to one terminal of the switch circuit 43. The other terminal of the switch circuit 43 is connected to a connection point between the second electrode of the capacitor $C_1$ and the inverting input terminal (−) of the comparator 40a. The switch circuit 43 corresponds to the reset circuit 3401 illustrated in FIG. 7, and is controlled to a conductive/non-conductive state, for example, according to a control signal (not illustrated) from the row drive circuit 251. When the switch circuit 43 is in the conductive state, the voltage of the capacitor $C_1$ is reset to a signal $V_{comp}$ output immediately before by the comparator 40a.

In the comparator 41a, a predetermined threshold voltage $Vb_{A1}$ as a second reference voltage is applied to a non-inverting input terminal (+) as a fourth input terminal. The comparator 41a compares the signal $V_{comp1}$ applied to the inverting input terminal (−) with the threshold voltage $Vb_{A1}$ input to the non-inverting input terminal (+), and outputs a signal $V_{comp2}$ indicating a comparison result. The signal $V_{comp2}$ is output from the detection unit 340a and stored in the memory 341.

Figure 8B:
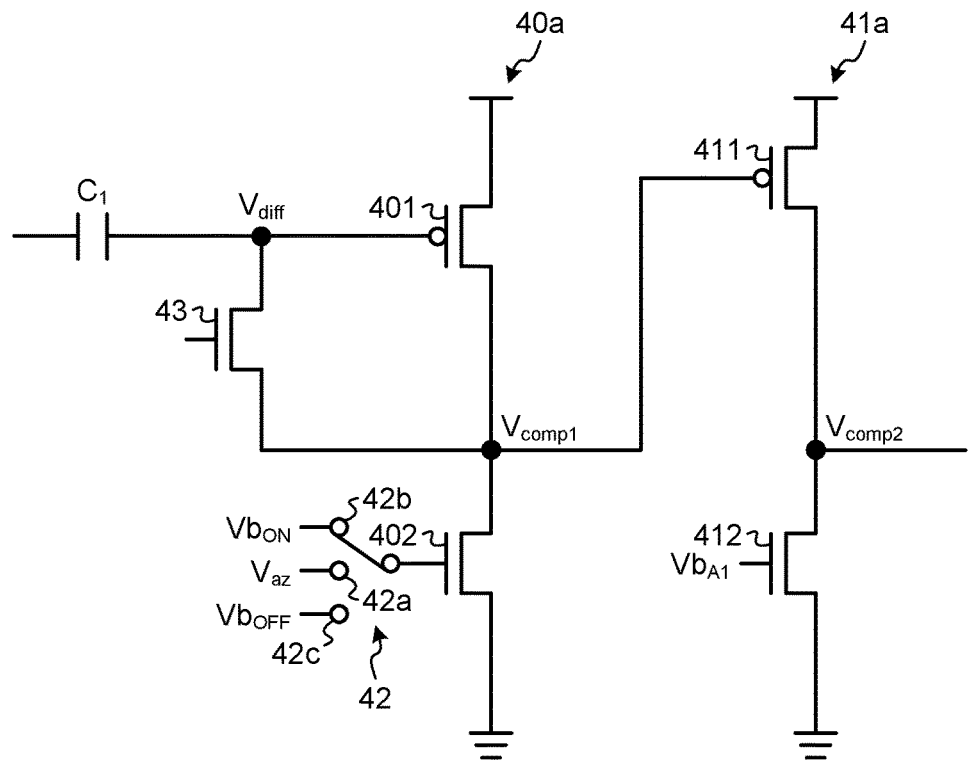
FIG. 8B is a circuit diagram illustrating the example of the configuration of the detection unit according to the first embodiment.

FIG. 8B is a circuit diagram illustrating the example of the configuration of the detection unit 340b according to the first embodiment. In FIG. 8B, a comparator 40a includes a transistor 401 which is a pMOS transistor and a transistor 402 which is an nMOS transistor. Furthermore, in this example, the switch circuit 43 is constituted by an nMOS transistor.

A source of the transistor 401 is connected to a power supply terminal Vdd, and a drain of the transistor 401 is connected to a drain of the transistor 402. The source of the transistor 402 is connected to a ground terminal. A signal $V_{comp1}$, which is an output of the comparator 40a, is extracted from a connection point between the drain of the transistor 401 and the drain of the transistor 402. Furthermore, one terminal of the switch circuit 43 (e.g., a drain of the nMOS transistor) is connected to the connection point. A second electrode of a capacitor $C_1$ is connected to a gate of the transistor 401, and the other terminal of the switch circuit 43 (e.g., a source of the nMOS transistor) is connected to a connection point between the gate of the transistor 401 and the capacitor $C_1$.

A comparator 41a includes a transistor 411 which is a pMOS transistor and a transistor 412 which is an nMOS transistor. A source of the transistor 411 is connected to a power supply terminal Vdd, and a drain of the transistor 411 is connected to a drain of the transistor 412. A source of the transistor 412 is connected to a ground terminal.

The connection point between the drain of the transistor 401 and the drain of the transistor 402 in the comparator 40a is connected to a gate of the transistor 411 in the comparator 41a. That is, the signal $V_{comp1}$, which is an output of the comparator 40a extracted from the connection point, is applied to the gate of the transistor 411. A predetermined threshold voltage $Vb_{A1}$ is applied to a gate of the transistor 412. A signal $V_{comp2}$, which is an output of the comparator 41a, is extracted from a connection point between the drain of the transistor 411 and the drain of the transistor 412.

In such a configuration, the comparator 40a compares a voltage of a signal $V_{diff}$ applied to the gate of the transistor 401 with a threshold voltage $Vb_{A0}$ applied to a gate of the transistor 402. When the voltage of the signal $V_{diff}$ is higher than the threshold voltage $Vb_{A0}$ as a comparison result, the comparator 40a transitions the state of the signal $V_{comp1}$, which is an output of the comparator 40a, for example, from a high level to a low level.

The comparison operation of the comparator 40a will be described. When a threshold voltage $Vb_{A0}$ (any one of voltages $Vb_{on}$, $Vb_{off}$, and $V_{az}$) is applied to the gate of the transistor 402, which is an nMOS transistor, a drain current $Ids_n$ corresponding to the voltage applied to the gate of the transistor 402 flows through the drain of the transistor 402. In addition, when a voltage (voltage $V_{diff}$) is applied to the gate of the transistor 401, which is a pMOS transistor, a drain current $Ids_p$ flows through the transistor 401. Here, when [current $Ids_n$>current $Ids_p$], the transistor 402 has a larger current, and accordingly, a potential of an output voltage of the transistor 402 falls toward the ground potential side, and the output signal $V_{comp1}$ becomes a low level. On the other hand, when [current $Ids_n$<current $Ids_p$], the transistor 401 has a larger current, and accordingly, an output potential of the transistor 401 rises toward the power supply side, and the signal $V_{comp1}$ becomes a high level. In this manner, the comparator 40a operates to compare the signal $V_{diff}$ applied to the gate of the transistor 401 with the threshold voltage $Vb_{A0}$ applied to the gate of the transistor 402.

The comparator 41a compares the signal $V_{comp1}$, which is an output of the comparator 40a, with the threshold voltage $Vb_{A1}$ applied to the gate of the transistor 412. When the signal $V_{comp1}$ is higher than the threshold voltage $Vb_{A1}$, the comparator 41a transitions the state of the signal $V_{comp1}$, which is an output of the comparator 41a, for example, from a low level to a high level, for example.

Here, as described above, the drain current $Ids_n$ of the transistor 402 changes according to the gate potential of the transistor 402, which is an nMOS transistor. At that time, the drain current $Ids_p$ in the transistor 401, which is a pMOS transistor, also changes to be balanced with the drain current $Ids_n$. At that time, it can be seen that the potential applied to the gate of the transistor 401 also changes, and the threshold from the transistor 401 changes. At this time, it can be seen that a change in threshold voltage $Vb_{on}$ or $Vb_{off}$ in a direction in which the amount of change in gate potential of the transistor 401 required to reach the threshold is large decreases the inverting capability of the comparator 40a, which can be considered to be equivalent to decreasing the gain of the comparator 40a.

Here, the comparator 40a is configured to gently perform threshold determination based on the threshold voltage $Vb_{a0}$ with respect to the signal $V_{diff}$ input to the inverting input terminal (−) as compared with the threshold determination in the comparator 41a. That is, the comparator 40a is configured such that a falling (or rising) speed of the signal $V_{comp1}$ when the voltage (signal $V_{diff}$) input to the inverting input terminal (−) is higher than the threshold voltage $Vb_{A0}$ is slower than a falling (or rising) speed of the signal $V_{comp1}$ when the voltage (signal $V_{comp1}$) input to the inverting input terminal (−) is higher than the threshold voltage $Vb_{A1}$ in the comparator 41a.

Note that, although each of the transistors 401 and 411 is a pMOS transistor and each of the transistors 402 and 412 is an nMOS transistor in FIG. 8B, the present disclosure is not limited to this example. For example, each of the transistors 401 and 411 may be an nMOS transistor, and each of the transistors 402 and 412 may be a pMOS transistor.

Figure 9A:
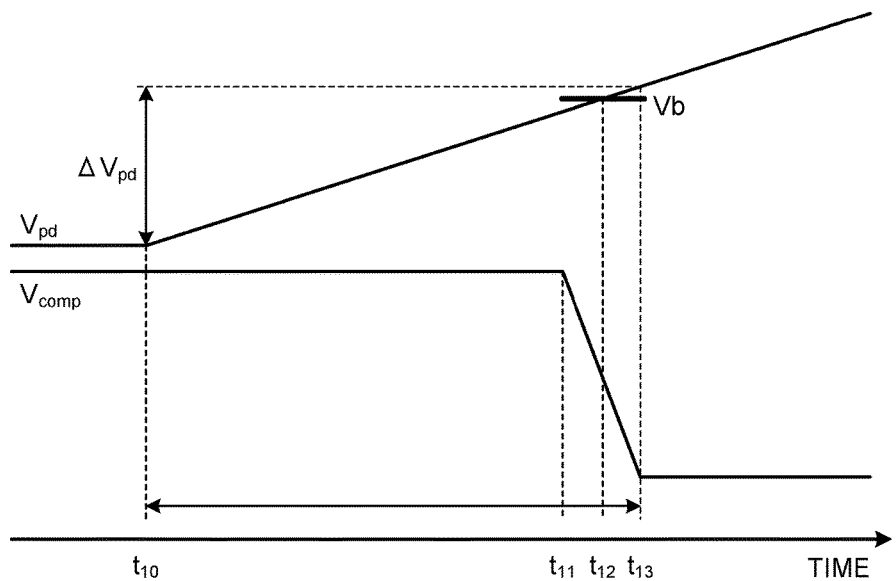
FIGS. 9A and 9B are schematic diagrams for explaining the operation of the detection unit according to the first embodiment.
Figure 9B:
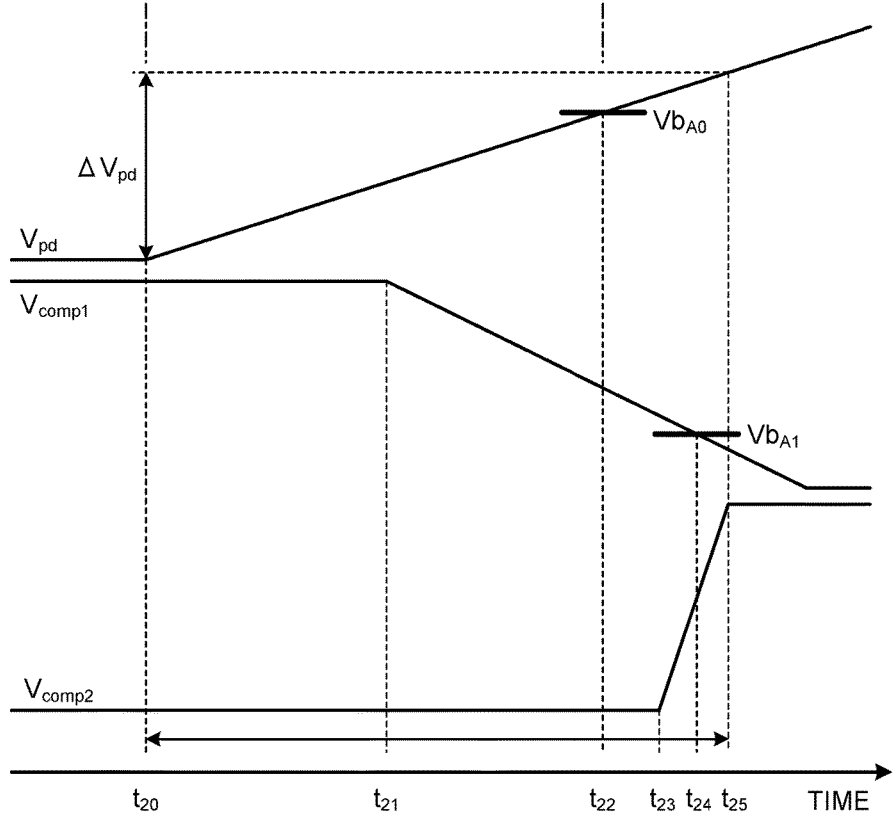

FIGS. 9A and 9B are schematic diagrams for explaining the operation of the detection unit 340b according to the first embodiment. In each of FIGS. 9A and 9B, the horizontal axis represents a time, and the vertical axis represents each voltage.

FIG. 9A illustrates an example of the operation of the detection unit 340a according to the conventional technology described with reference to FIG. 7. The upper part of FIG. 9A illustrates a voltage signal Vpd applied to the first electrode of the capacitor C1, and the lower part of FIG. 9A illustrates a signal Vcomp output from the comparator 3400. In addition, here, a (+) event in which the light amount has increased is illustrated.

FIG. 9A, the voltage signal Vpd starts to rise, for example, from time t10. The comparator 3400 outputs a high-state signal Vcomp at the time t10. When the voltage signal Vpd is equal to or lower than a threshold voltage Vb, the comparator 3400 outputs a high-state voltage Vcomp. The voltage signal Vpd is higher than the threshold voltage Vb at time t12. In the comparator 3400, the signal Vcomp starts to fall at time t11 before the time t11, the falling of the signal Vcomp ends at time t13, and the signal Vcomp transitions to a low state.

FIG. 9B illustrates an example of the operation of the detection unit 340b according to the first embodiment described with reference to FIGS. 8A and 8B. As described above, the upper part of FIG. 9B illustrates a voltage signal Vpd applied to the first electrode of the capacitor C1, the middle part of FIG. 9B illustrates a signal Vcomp1 output from the comparator 40a, and the lower part of FIG. 9B illustrates a signal Vcomp2 output from the comparator 41a. Note that a change in voltage signal Vpd in the upper part of FIG. 9B is the same as the change in voltage signal Vpd in the upper part of FIG. 9A. In addition, a threshold voltage VbA0 in the comparator 40a is the same as the threshold voltage Vb in the comparator 3400.

In of FIG. 9B, the voltage signal Vpd starts to rise, for example, from time t20 (corresponding to the above-described time t10). When the voltage signal Vpd is equal to or lower than the threshold voltage Vb, the comparator 40a outputs a high-state signal Vcomp1. The voltage signal Vpd is higher than the threshold voltage VbA0 at time t21. Note that a slope of the rise of the voltage signal Vpd is the same as the slope in FIG. 9A, and a period from the time t20 to the time t21 is the same as the period from the time t10 to the time t11 described above.

In the comparator 40a, the signal $V_{comp1}$ starts to fall at time $t_{21}$ before the time $t_{21}$. At this time, a falling speed of the signal $V_{comp1}$ is slower than a falling speed of the signal $V_{comp}$ described above, and thus, the time $t_{21}$ at which the falling starts is a time earlier than the above-described time $t_{11}$.

The comparator 41a compares the signal $V_{comp1}$ with the threshold voltage $Vb_{A1}$. When the signal $V_{comp1}$ is equal to or lower than the threshold voltage $Vb_{A1}$, the comparator 41a outputs a low-state signal $V_{comp2}$. The voltage of the signal $V_{comp1}$ is higher than the threshold voltage $Vb_{A1}$ at time $t_{24}$. In this case, the voltage of the signal $V_{comp1}$ is higher than the threshold voltage $Vb_{A1}$ in a negative direction. In the comparator 41a, the signal $V_{comp2}$ starts to rise at time $t_{23}$ before the time $t_{24}$, the rising of the signal $V_{comp2}$ ends at time $t_{25}$, and the signal $V_{comp2}$ transitions to a high state.

The time $t_{25}$ corresponds to a determination result based on threshold voltage $Vb_{A1}$ with respect to the signal $V_{comp1}$ that changes slowly. Therefore, the time is delayed as compared with the time $t_{13}$ when the determination is made directly with respect to the voltage signal $V_{pd}$ based on the threshold voltage Vb according to the conventional technology. Therefore, in the detection unit 340b according to the first embodiment, by appropriately setting the threshold voltage $Vb_{A1}$ for the comparator 41a, an input change amount $\Delta V_{pd}$ until the determination is made with respect to the voltage signal $V_{pd}$ can be larger than the input change amount $\Delta V_{pd}$ according to the conventional technology. As a result, it is possible to lower contrast sensitivity as compared with that of the detection unit 340a according to the conventional technology.

Note that the slow change in signal $V_{comp1}$ can be generally realized by changing a circuit constant. For example, if the gain of the comparator 40a is decreased by increasing the drain current of the transistor 402 or decreasing the W size of the transistor 401, the change in the signal $V_{comp1}$ can be gentle.

Figure 10:
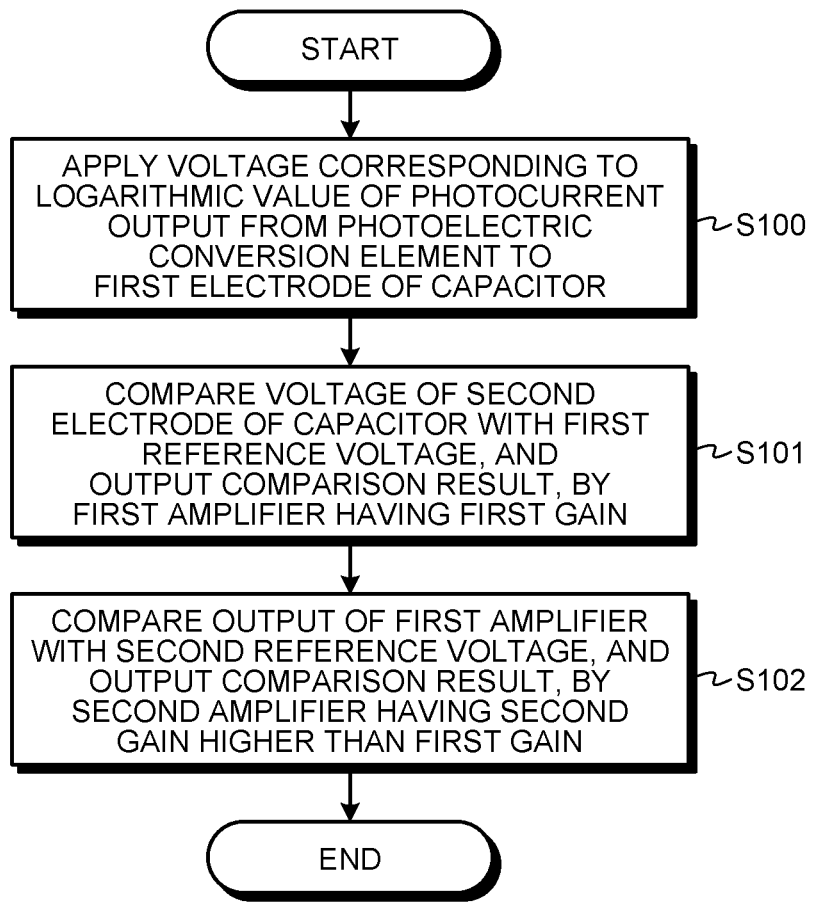
FIG. 10 is an example of a flowchart for explaining the operation of the detection unit according to the first embodiment.

FIG. 10 is an example of a flowchart for explaining the operation of the detection unit 340b according to the first embodiment. In step S100, in the detection unit 340b, a voltage of a voltage signal $V_{pd}$ corresponding to a logarithmic value of a photocurrent $I_{pht}$ output from the photoelectric conversion element 310 is applied to the first electrode of the capacitor $C_1$.

In the next step S101, in the detection unit 340b, the comparator 40a as a first amplifier having a first gain compares a voltage of a signal $V_{diff}$ of the second electrode of the capacitor $C_1$ applied to a first input terminal which is an inverting input terminal (−) with a first reference voltage applied to a second input terminal which is a non-inverting input terminal (+). The first reference voltage is a threshold voltage $Vb_{A0}$ to which the voltage $V_{az}$, $Vb_{on}$, or $Vb_{off}$ switches at a predetermined timing. The comparator 40a outputs a signal $V_{comp1}$ as a comparison result obtained by comparing the voltage of the signal $V_{diff}$ with the threshold voltage $Vb_{A0}$.

The signal $V_{comp1}$ output from the comparator 40a is input to a third input terminal as an inverting input terminal (−) of the comparator 41a as a second amplifier having a second gain higher than the first gain.

In the next step S102, in the detection unit 340b, the comparator 41a compares a voltage of the signal $V_{comp1}$ as an output of the comparator 40a input to a third input terminal with a second reference voltage applied to a fourth input terminal as a non-inverting input terminal (+). The second reference voltage is a predetermined threshold voltage $Vb_{A1}$. The comparator 41a compares the voltage of the signal $V_{comp1}$ output from the comparator 40a with the threshold voltage $Vb_{A1}$, and outputs a signal $V_{comp2}$ as a comparison result.

The signal $V_{comp2}$ output from the comparator 41a is, for example, output from the detection unit 340b and stored in the memory 341.

(3-1. First Modification of First Embodiment)

Figure 11A:
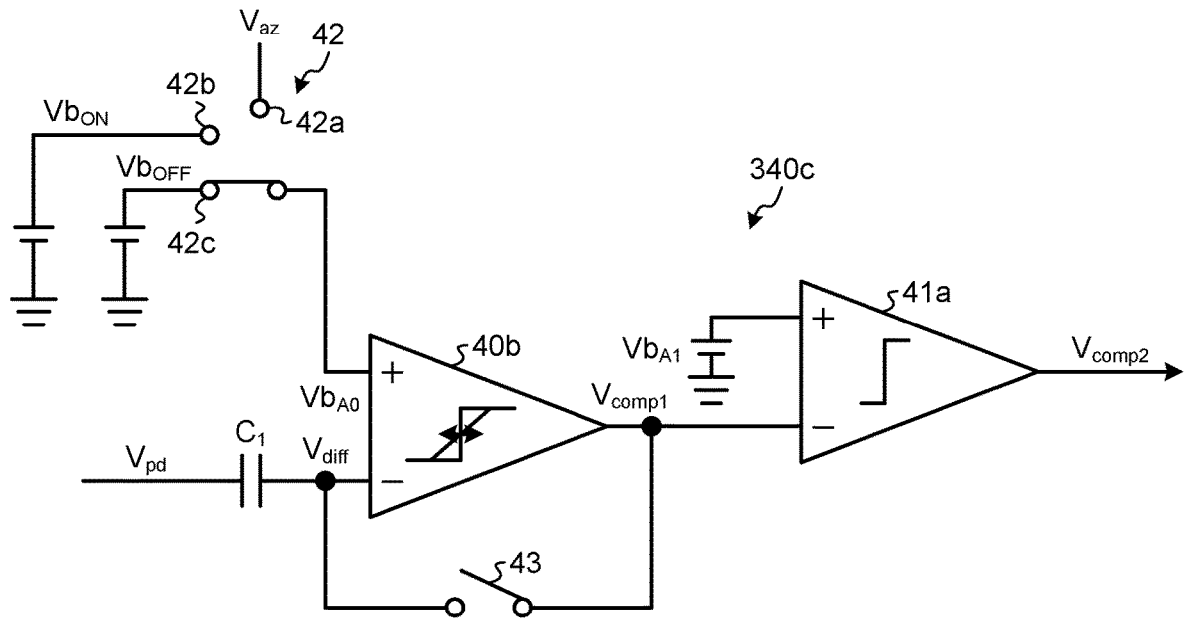
FIG. 11A is a diagram illustrating an example of a configuration of a detection unit according to a first modification of the first embodiment.

Next, a first modification of the first embodiment will be described. The first modification of the first embodiment is an example in which the gain of the input-side comparator is directly changed. FIG. 11A is a diagram illustrating an example of a configuration of a detection unit 340c according to the first modification of the first embodiment. In FIG. 11A, the voltages $Vb_{on}$ and $Vb_{off}$ applied to the selection input terminals 42b and 42c, respectively, of the switch circuit 42 have fixed voltage values. Furthermore, a comparator 40b has a variable gain.

Figure 11B:
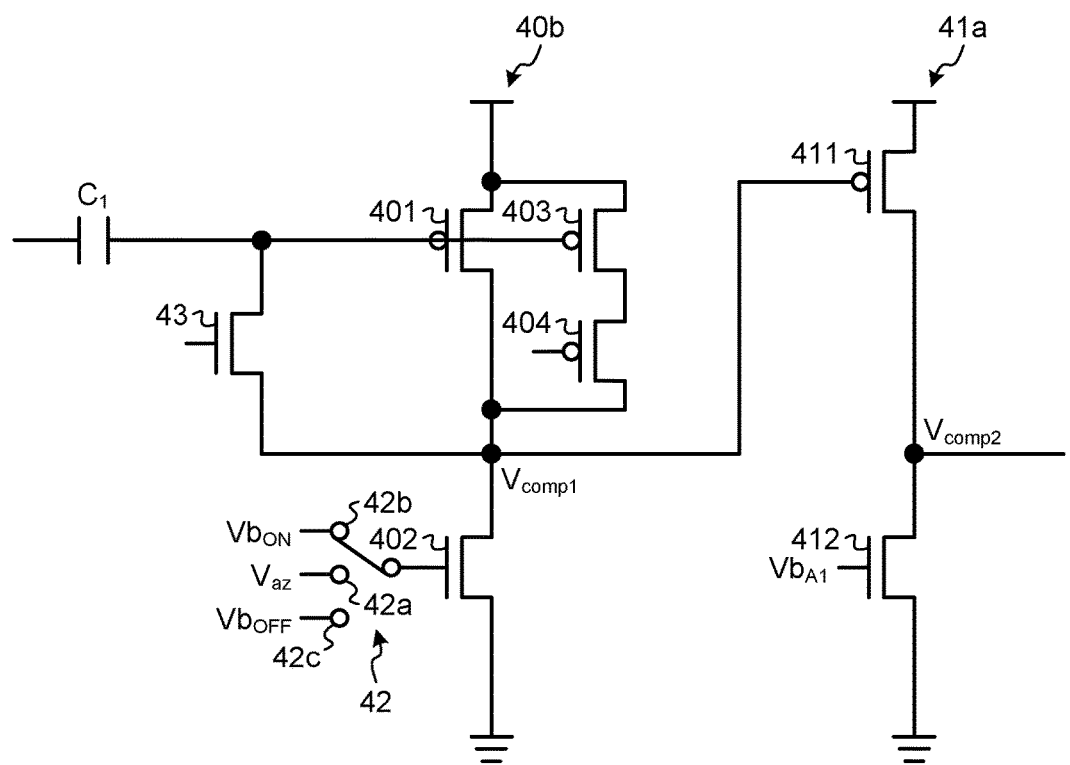
FIG. 11B is a circuit diagram illustrating the example of the configuration of the detection unit according to the first modification of the first embodiment.

FIG. 11B is a circuit diagram illustrating the example of the configuration of the detection unit 340c according to the first modification of the first embodiment. In the comparator 40b illustrated in FIG. 11B, transistors 403 and 404, each being a pMOS transistor, are added to the above-described comparator 40a illustrated in FIG. 8B. The other configurations are the same as those described with reference to FIG. 8B, and thus, the description thereof will be omitted here.

The transistor 403 has a gate connected to the gate of the transistor 401, a source connected to the source of the transistor 401, and a drain connected to a source of the transistor 404. A drain of the transistor 404 is connected to the drain of the transistor 401. That is, the transistor 403 is connected to the transistor 401 in parallel when the transistor 404 is in a turn-on state. Therefore, by controlling a voltage applied to a gate of the transistor 404, it is possible to make a switch as to whether the transistor 401 is used alone or connected to the transistor 403 in parallel. That is, by controlling the voltage applied to the gate of the transistor 404, the elements constituting the comparator 40b are switched.

By connecting the transistors 401 and 403 in parallel with each other, a larger gain can be obtained as compared with a gain obtained in a case where the transistor 401 is used alone. For example, it may be considered that the transistor 404 is turned on to connect the transistors 401 and 403 in parallel with each other for use in an environment with a normal or small light amount, and the transistor 404 is turned off to use the transistor 401 alone for use in an environment with a large light amount.

As described above, in the detection unit 340c according to the first modification of the first embodiment, since the gain of the input-side comparator 40b can be changed, contrast sensitivity can be lowered as compared with that of the detection unit 340a according to the conventional technology.

(3-2. Second Modification of First Embodiment)

Figure 12:
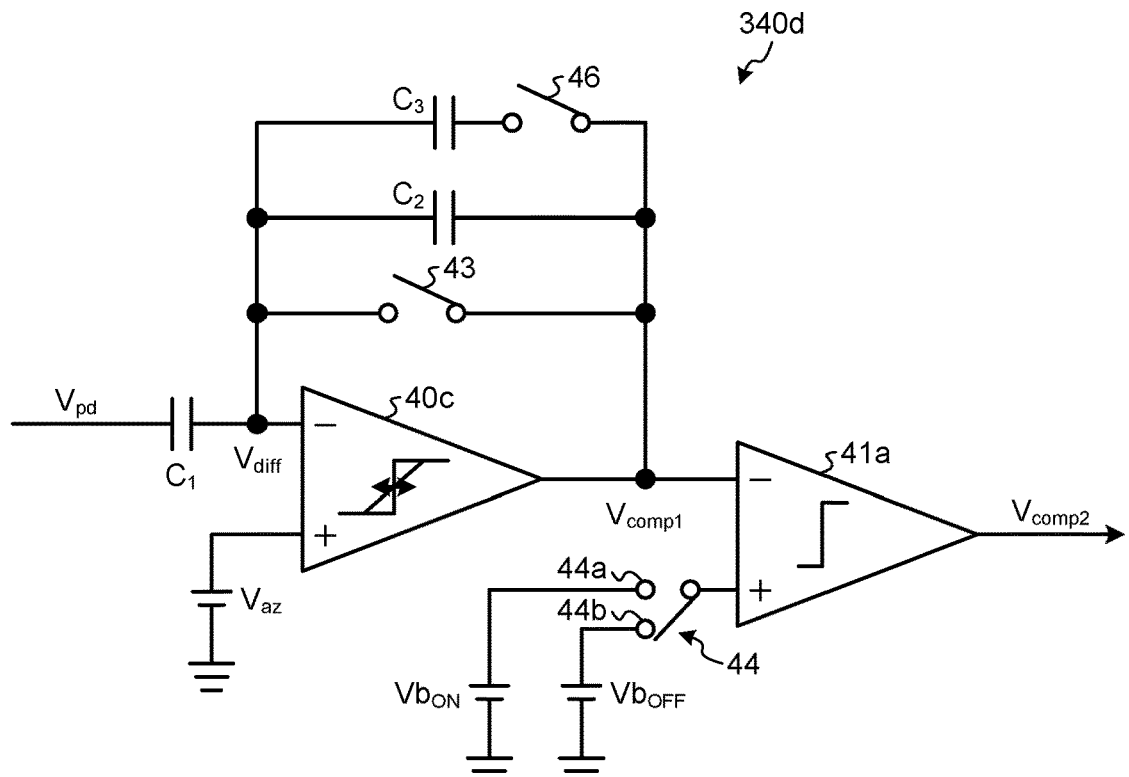
FIG. 12 is a diagram illustrating an example of a configuration of a detection unit according to a second modification of the first embodiment.

Next, a second modification of the first embodiment will be described. The second modification of the first embodiment is an example in which the input-side comparator is used as an amplifier to which negative feedback can be applied and, and a gain is changed using a capacitance ratio related to the negative feedback. FIG. 12 is a diagram illustrating an example of a configuration of a detection unit 340d according to the second modification of the first embodiment.

In FIG. 12, the comparator 40c is constituted by, for example, a similar circuit to the comparator 40a illustrated in FIG. 8B, and can be used as an amplifier (operational amplifier) to which negative feedback can be applied by a capacitor $C_2$ and a capacitor $C_3$ via a switch circuit 46.

In FIG. 12, an output terminal of the comparator 40c is connected to one terminal of the switch circuit 43, one terminal of the capacitor $C_2$, and one terminal of the switch circuit 46. The other terminal of the switch circuit 46 is connected to one terminal of the capacitor $C_3$. The other terminal of each of the switch circuit 43, the capacitor $C_2$, and the capacitor $C_3$ is connected to an inverting input terminal (−) of the comparator 40c. In addition, a voltage $V_{az}$ is applied to a non-inverting input terminal (+) of the comparator 40c.

Meanwhile, an output terminal of the comparator 40c is connected to the inverting input terminal (−) of the comparator 41a. A selection output terminal of a switch circuit 44 is connected to the non-inverting input terminal (+) of the comparator 41a. Voltages $Vb_{on}$ and $Vb_{off}$ are connected to selection input terminals 44a and 44b of the switch circuit 44, respectively. The switch circuit 44 selects one of the selection input terminals 44a and 44b, for example, according to the control of the row drive circuit 251, and inputs one of the voltages $Vb_{on}$ and $Vb_{off}$ as a threshold voltage $Vb_{A1}$ to the non-inverting input terminal (+) of the comparator 41a.

In such a configuration, a gain G of the comparator 40c as an amplifier is determined based on a ratio between a capacitance of the capacitor $C_1$ and a capacitance of a capacitor connected for negative feedback. That is, the gain G of the comparator 40c is obtained by the following equation (1) when the switch circuit 46 is in a conductive state, and is obtained by the following equation (2) when the switch circuit 46 is in a non-conductive state.

$$G=C_1/(C_2+C_3) \quad (1)$$

$$G=C_1/C_2 \quad (2)$$

As can be seen from the equations (1) and (2), by bringing the switch circuit 46 into the conductive state, the gain G can be decreased as compared with that in a case where the switch circuit 46 is in the non-conductive state, thereby widening a dynamic range for the signal $V_{diff}$ at the inverting input terminal (−). That is, the switch circuit 46 functions as a gain change unit that changes a gain of the comparator 40c by changing a capacitance through the capacitors $C_2$ and $C_3$ as elements constituting the comparator 40c.

Therefore, for example, it is possible to detect a large change in light amount by bringing the switch circuit 46 into the conductive state for use in an environment with a large amount of light, and it is possible to detect a small change in light amount by bringing the switch circuit 46 into the non-conductive state for use in an environment with a small amount of light.

A signal $V_{comp1}$ output from the comparator 40a is input to the inverting input terminal (−) of the comparator 41a. The comparator 41a compares the signal $V_{comp1}$ input to the inverting input terminal (−) with the threshold voltage $Vb_{A1}$ which is a voltage $Vb_{on}$ or $Vb_{off}$ applied to the non-inverting input terminal (+) via the switch circuit 44, and outputs a signal $V_{comp2}$ as a comparison result.

(3-3. Third Modification of First Embodiment)

Figure 13:
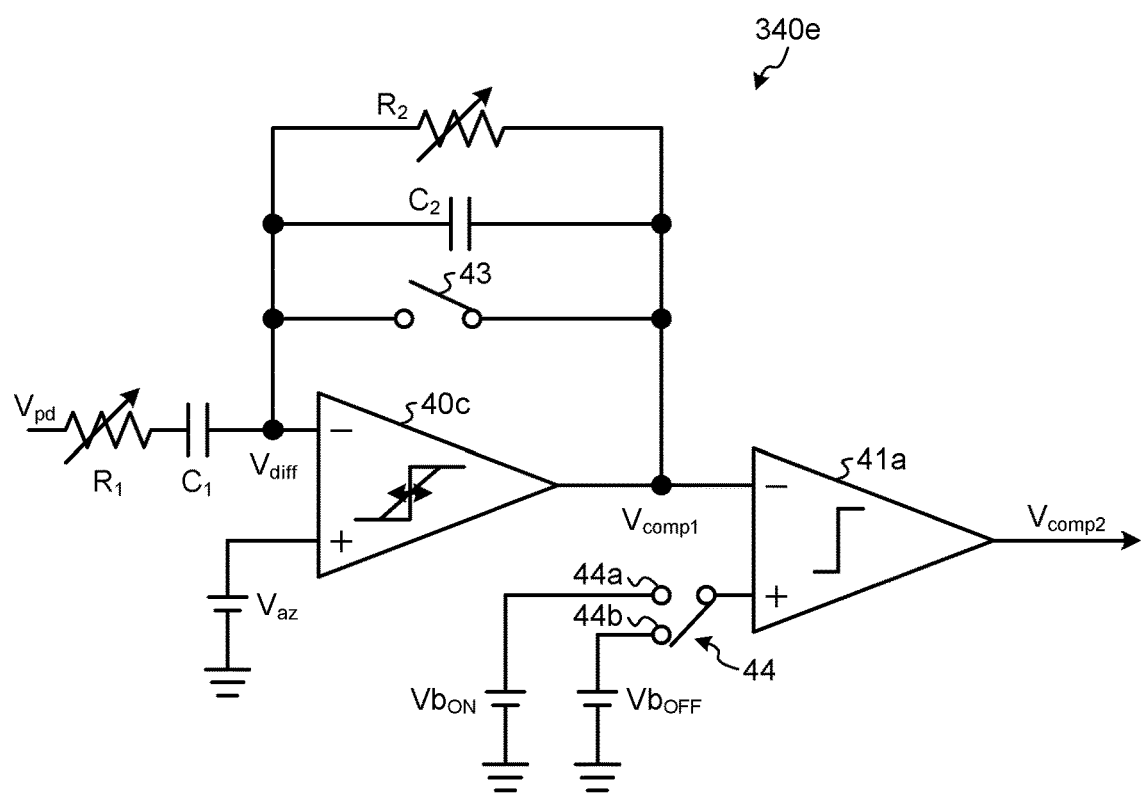
FIG. 13 is a diagram illustrating an example of a configuration of a detection unit according to a third modification of the first embodiment.

Next, a third modification of the first embodiment will be described. The third modification of the first embodiment is an example in which the input-side comparator is used as an amplifier to which negative feedback can be applied and, and a gain is changed using a resistance ratio related to the negative feedback. FIG. 13 is a diagram illustrating an example of a configuration of a detection unit 340e according to the third modification of the first embodiment.

In FIG. 13, the comparator 40c is constituted by, for example, a similar circuit to the comparator 40a illustrated in FIG. 8B, and can be used as an amplifier (operational amplifier) to which negative feedback can be applied by a capacitor $C_2$ and a resistor $R_2$ having a variable resistance, the capacitor $C_2$ and the resistor $R_2$ being connected to each other in parallel.

In FIG. 13, an output terminal of the comparator 40c is connected to one terminal of the switch circuit 43, one terminal of the capacitor $C_2$, and one terminal of the resistor $R_2$. The other terminal of each of the capacitor $C_2$ and the resistor $R_2$ is connected to an inverting input terminal (−) of the comparator 40c. In addition, a resistor $R_1$ having a variable resistance value has one terminal to which a voltage signal $V_{pd}$ is input, and the other terminal connected to the first electrode of the capacitor $C_1$. The second electrode of the capacitor $C_1$ is connected to the inverting input terminal (−) of the comparator 40c together with the other terminals of the capacitor $C_2$ and the resistor $R_2$.

The comparator 41a has the same configuration as that illustrated in FIG. 12, and thus, the description thereof will be omitted here.

In such a configuration, a gain G of the comparator 40c as an amplifier is determined based on a ratio between a resistance value of the resistor $R_1$ and a resistance value of the resistor $R_2$ connected for negative feedback. That is, the gain G of the comparator 40c is obtained by the following equation (3).

$$G=R_2/R_1 \quad (3)$$

As can be seen from the equation (3), the gain G of the comparator 40c can be changed by changing the resistance value of at least one of the resistors $R_1$ and $R_2$. For example, by decreasing the resistance value of the resistor $R_2$ or increasing the resistance value of the resistor $R_1$, the gain G of the comparator 40c can be decreased, thereby widening a dynamic range for the signal $V_{diff}$ at the inverting input terminal (−). That is, at least one of the resistors $R_1$ and $R_2$ functions as a gain change unit that changes a gain of the comparator 40c by changing a resistance of the resistor $R_1$ or $R_2$ as an element constituting the comparator 40c.

Therefore, for example, it is possible to detect a large change in light amount by decreasing the resistance value of the resistor $R_2$ for use in an environment with a large amount of light, and it is possible to detect a small change in light amount by increasing the resistance value of the resistor $R_2$ for use in an environment with a small amount of light.

A signal $V_{comp1}$ output from the comparator 40a is input to the inverting input terminal (−) of the comparator 41a. The comparator 41a compares the signal $V_{comp1}$ input to the inverting input terminal (−) with the threshold voltage $Vb_{A1}$ which is a voltage $Vb_{on}$ or $Vb_{off}$ applied to the non-inverting input terminal (+) via the switch circuit 44, and outputs a signal $V_{comp2}$ as a comparison result.

4. Second Embodiment

Next, a second embodiment of the present disclosure will be described. In the first embodiment and the modifications thereof described above, a gain of the input-side comparator of the two comparators connected to each other in series is changed. In contrast, in the second embodiment, a gain of the output-side comparator of the two comparators is changed.

Figure 14A:
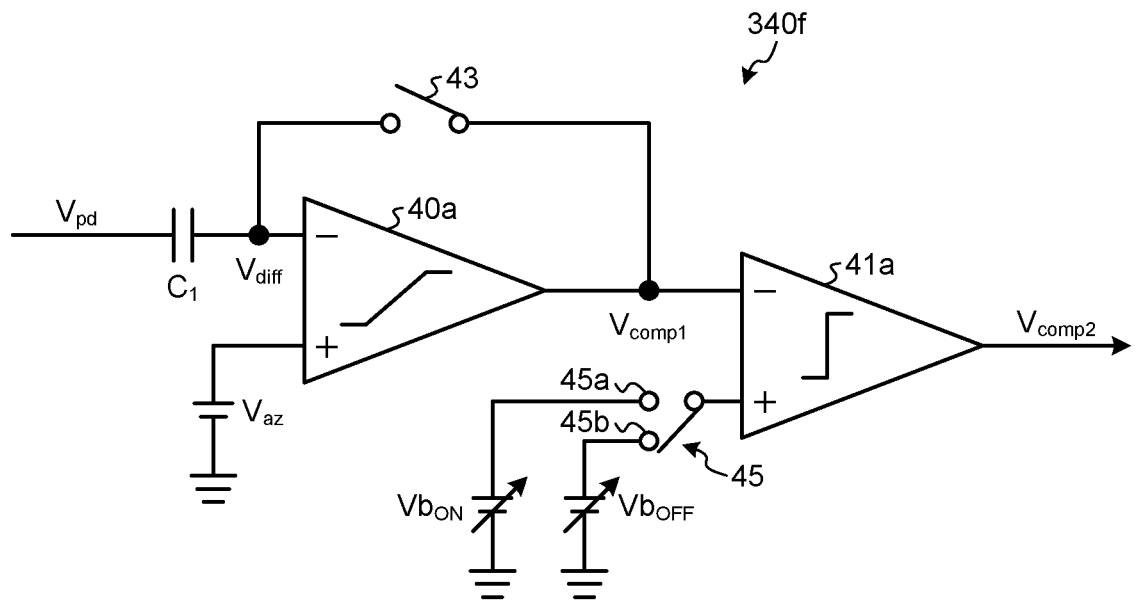
FIG. 14A is a diagram illustrating an example of a configuration of a detection unit according to a second embodiment.

FIG. 14A is a diagram illustrating an example of a configuration of a detection unit 340f according to the second embodiment. In FIG. 14A, the detection unit 340f includes a capacitor $C_1$, comparators 40a and 41a connected to each other in series, each having a configuration as an amplifier, and switch circuits 43 and 44.

A voltage signal $V_{pd}$ output from the light receiving circuit 31 is applied to the first electrode of the capacitor $C_1$ via the buffer 33, and a signal $V_{diff}$ is input from the second electrode of the capacitor $C_1$ to the inverting input terminal (−) of the comparator 40a which is an input-side amplifier. A voltage $V_{az}$ is applied to the non-inverting input terminal (+) of the comparator 40a.

Note that, in the second embodiment as well, similarly to the first embodiment described above, the comparator 40a is configured to gently perform threshold determination based on the threshold voltage $Vb_{a0}$ with respect to the signal $V_{diff}$ input to the inverting input terminal (−) as compared with the threshold determination in the comparator 41a.

A signal $V_{comp1}$ output from the comparator 40a is input to the inverting input terminal (−) of the comparator 41a. A selection output terminal of a switch circuit 45 is connected to the non-inverting input terminal (+) of the comparator 41a. Voltages $Vb_{on}$ and $Vb_{off}$ having variable voltage values are connected to selection input terminals 45a and 45b of the switch circuit 45, respectively. The switch circuit 45 selects one of the selection input terminals 45a and 45b, for example, according to the control of the row drive circuit 251, and inputs one of the voltages $Vb_{on}$ and $Vb_{off}$ as a threshold voltage $Vb_{A1}$ to the non-inverting input terminal (+) of the comparator 41a.

In the second embodiment, the voltages $Vb_{on}$ and $Vb_{off}$ have variable voltage values. For example, the smaller the absolute value of the difference between the voltage values of the voltage $Vb_{on}$ or $Vb_{off}$ and the voltage $V_{az}$, the higher the sensitivity (contrast sensitivity) in detecting a change in light amount. That is, this corresponds to increasing the gain of the comparator 41a. By increasing the gain of the comparator 41a, the gain of the comparator 40a becomes relatively decreased. In this manner, the voltage $Vb_{on}$ or $Vb_{off}$ functions as a gain change unit that changes the gain of the comparator 41a.

As an example, for use in an environment with a smaller amount of light, it may be considered to switch voltage values of the voltages $Vb_{on}$ and $Vb_{off}$ to decrease the absolute value of the difference from the voltage $V_{az}$.

Figure 14B:
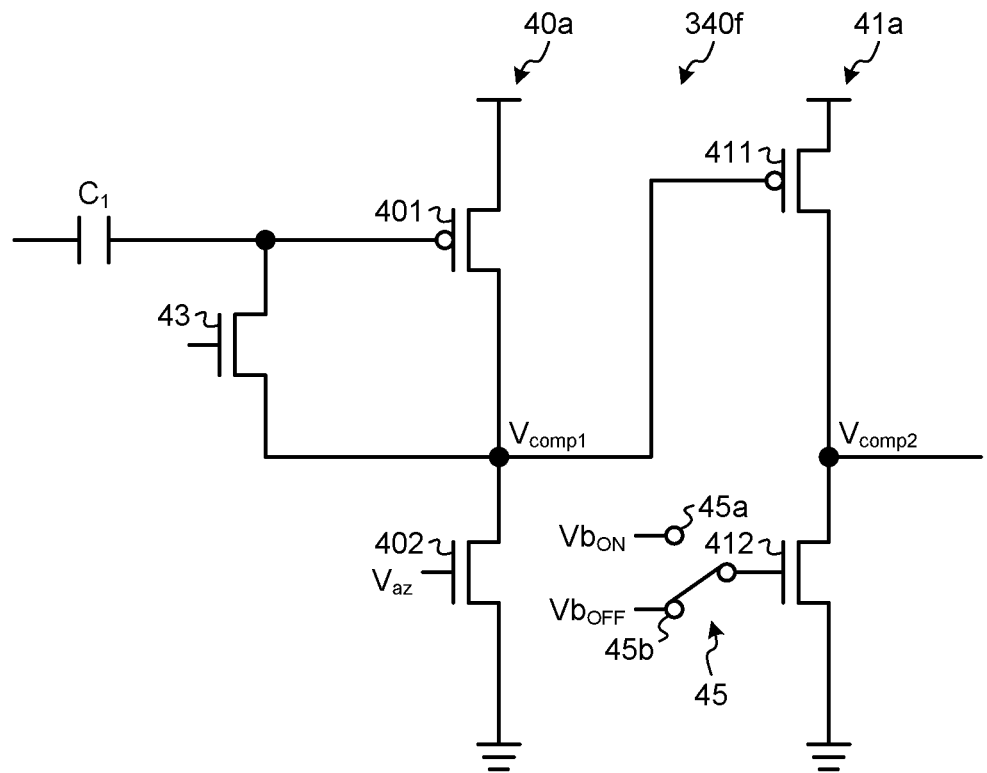
FIG. 14B is a circuit diagram illustrating the example of the configuration of the detection unit according to the second embodiment.

FIG. 14B is a circuit diagram illustrating the example of the configuration of the detection unit 340f according to the second embodiment. The comparator 40a illustrated in FIG. 14B has the same configuration as the comparator 40a illustrated in FIG. 8B except that a voltage $V_{az}$ is applied to the gate of the transistor 402. Furthermore, the comparator 41a has the same configuration as the comparator 41a illustrated in FIG. 8B except that a voltage $Vb_{on}$ or a voltage $Vb_{off}$ is applied to the gate of the transistor 412 via the switch circuit 45.

As described above, by making variable the voltage $Vb_{on}$ or $Vb_{off}$ applied as a threshold voltage $Vb_{A1}$ to the output-side comparator 41a of the two comparators 40a and 41a connected to each other in series, the gain of the comparator 40a can be relatively decreased, and accordingly, contrast sensitivity can be lowered. For example, it may be considered to change each of the voltages $Vb_{on}$ and $Vb_{off}$ applied to the output-side comparator 41a such that the absolute value of the difference of the voltage $Vb_{on}$ or $Vb_{off}$ from the voltage $V_{az}$ becomes a normal value for use in an environment with a normal or small light amount, and the absolute value of the difference of the voltage $Vb_{on}$ or $Vb_{off}$ from the voltage $V_{az}$ becomes a decreased value for use in an environment with a large light amount.

Note that, in the configuration illustrated in FIGS. 14A and 14B, since the signal $V_{comp1}$ input to the output-side comparator 41a has already been amplified in the input-side comparator 40a, the second embodiment is disadvantageous in decreasing a gain as compared with the first embodiment and the modifications thereof described above. Meanwhile, in a case where a plurality of input-side configurations to be described below are shared by one output-side configuration, it is possible to reduce the number of threshold control lines for controlling the switch circuit 45.

(4-1. Modification of Second Embodiment)

Next, a modification of the second embodiment will be described.

Figure 15A:
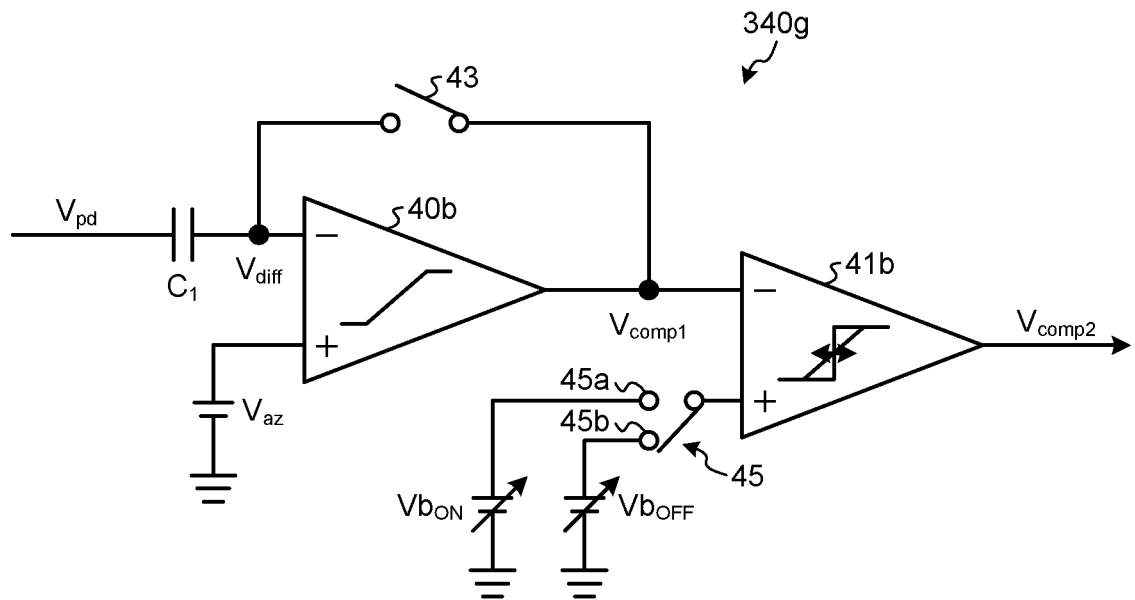
FIG. 15A is a diagram illustrating an example of a configuration of a detection unit according to a modification of the second embodiment.

Next, a modification of the second embodiment will be described. The modification of the second embodiment is an example in which the gain of the output-side comparator is directly changed. FIG. 15A is a diagram illustrating an example of a configuration of a detection unit 340g according to the modification of the second embodiment. In FIG. 15A, the voltages $Vb_{on}$ and $Vb_{off}$ applied to the selection input terminals 45a and 45b, respectively, of the switch circuit 45 have fixed voltage values. Furthermore, a comparator 41b has a variable gain.

Note that, in the modification of the second embodiment as well, similarly to the first embodiment described above, the comparator 40b is configured to gently perform threshold determination based on the voltage $V_{az}$ with respect to the signal $V_{diff}$ input to the inverting input terminal (−) as compared with the threshold determination in the comparator 41b.

Figure 15B:
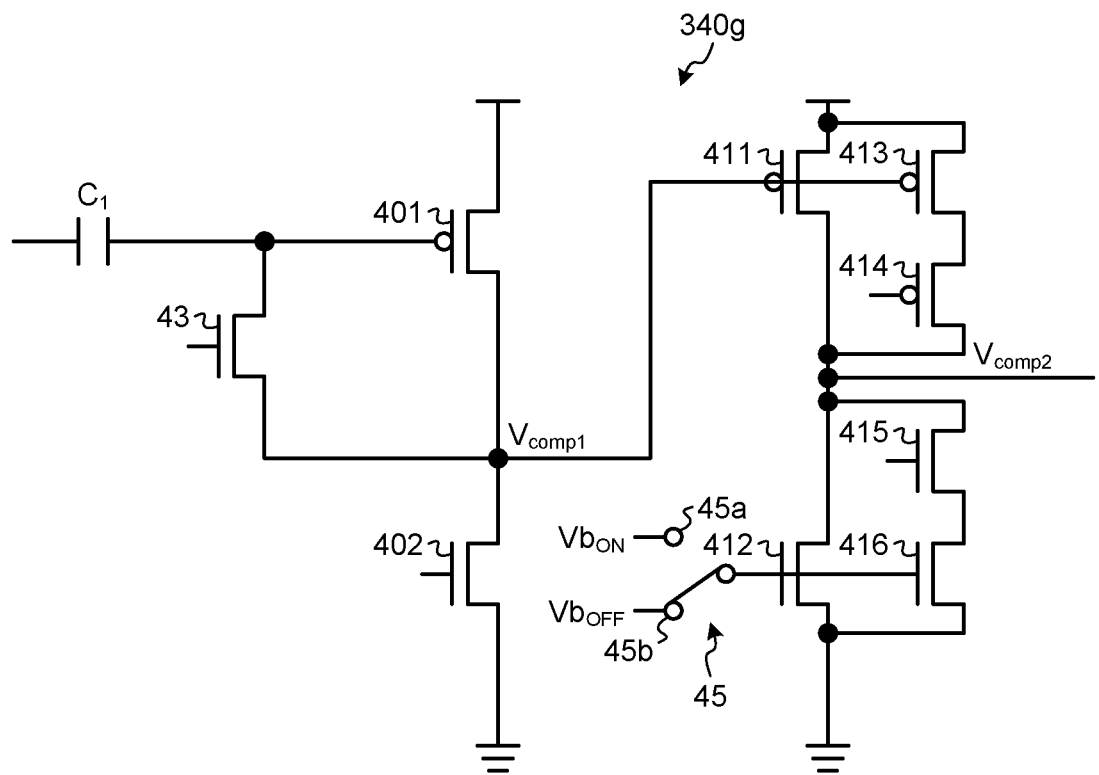
FIG. 15B is a circuit diagram illustrating the example of the configuration of the detection unit according to the modification of the second embodiment.

FIG. 15B is a circuit diagram illustrating the example of the configuration of the detection unit 340g according to the modification of the second embodiment. In the comparator 41b illustrated in FIG. 15B, transistors 413 and 414, each being a pMOS transistor, and transistors 415 and 416, each being an nMOS transistor, are added to the above-described comparator 41a illustrated in FIG. 14B. The other configurations are the same as those described with reference to FIG. 14B, and thus, the description thereof will be omitted here.

The transistor 413 has a gate connected to the gate of the transistor 411, a source connected to the source of the transistor 411, and a drain connected to a source of the transistor 414. A drain of the transistor 414 is connected to the drain of the transistor 411. That is, the transistor 413 is connected to the transistor 411 in parallel when the transistor 414 is in a turn-on state. Therefore, by controlling a voltage applied to a gate of the transistor 414, it is possible to make a switch as to whether the transistor 411 is used alone or connected to the transistor 413 in parallel.

Similarly, a transistor 416 has a gate connected to the gate of the transistor 412, a source connected to the source of the transistor 412, and a drain connected to a source of a transistor 415. A drain of the transistor 415 is connected to the drain of the transistor 412. That is, the transistor 416 is connected to the transistor 412 in parallel when the transistor 415 is in a turn-on state. Therefore, by controlling the voltage applied to the gate of the transistor 415, it is possible to switch whether the transistor 412 is used alone or connected to the transistor 416 in parallel.

That is, by controlling the voltages applied to the gates of the transistors 414 and 415, the elements constituting the comparator 41b are switched. Note that the transistors 414 and 415 are controlled to be turned on or off at the same time.

By connecting the transistors 411 and 413 to the transistors 412 and 416, respectively, in parallel, it is possible to obtain a gain larger than that in a case where one of the transistors 411 and 412 are used alone. For example, it may be considered that the transistors 414 and 415 are turned on to connect the transistors 411 and 413 to the transistors 412 and 416, respectively, in parallel for use in an environment with a normal or small light amount, and the transistors 414 and 416 are turned off to use one of the transistors 411 and 412 alone for use in an environment with a large light amount.

As described above, in the detection unit 340g according to the modification of the second embodiment, since the gain of the output-side comparator 41b can be changed, contrast sensitivity can be lowered as compared with that of the detection unit 340a according to the conventional technology.

5. Third Embodiment

Next, a third embodiment of the present disclosure will be described. The third embodiment is an example in which the output-side comparator of the two comparators connected to each other in series is shared by respective input-side comparators in a plurality of detection blocks 32.

Figure 16:
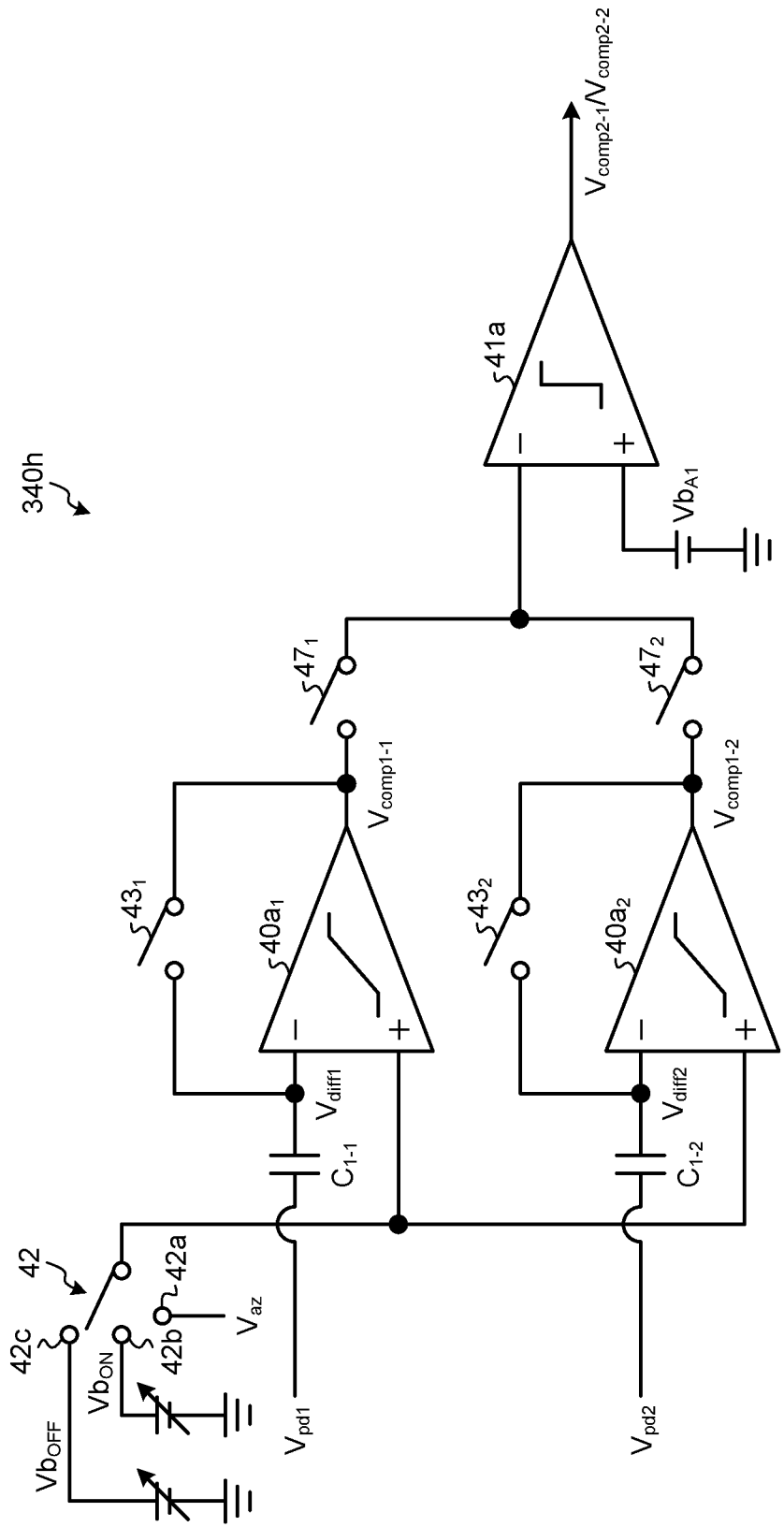
FIG. 16 is a diagram illustrating an example of a configuration of a detection unit according to a third embodiment.

FIG. 16 is a diagram illustrating an example of a configuration of a detection unit 340h according to the third embodiment. In the example of FIG. 16, one output-side comparator 41a is shared by two input-side comparators $40a_1$ and $40a_2$. The present disclosure is not limited to this example, and one output-side comparator 41a can be shared by three or more input-side comparators 40a.

As an example, referring to FIG. 3 described above, one shared block 221 includes two light receiving circuits 31, and these two light receiving circuits 31 correspond to two detection blocks 32, respectively (see FIG. 5). Referring to FIG. 6, in each detection block 32, the buffer 33 and the input-side comparator 40a included in the detection unit 340 are provided to correspond to each of the two light receiving circuits 31. The output-side comparator 41a included in the detection unit 340 and the memory 341 and the transfer circuit 342 included in the detection circuit 34 are shared by the two light receiving circuits 31.

In FIG. 16 the same circuit can be applied for each of the comparators $40a_1$ and $40a_2$ as the comparator 40a described, for example, with reference to FIG. 8B. A selection output of one switch circuit 42 is commonly connected to respective non-inverting input terminals (+) of the comparators $40a_1$ and $40a_2$. Voltages $V_{az}$, $Vb_{on}$, and $Vb_{off}$ are applied to the selection input terminals 42a, 42b, and 42c of the switch circuit 42, respectively. Among them, the voltages $Vb_{on}$ and $Vb_{off}$ are variable. The output of the switch circuit 42 is commonly applied as a threshold voltage $Vb_{A0}$ to the comparators $40a_{1-1}$ and $40a_{1-2}$.

A voltage signal $V_{pd1}$ output from one of the two light receiving circuits 31 sharing the comparator 41a is applied to a first electrode of a capacitor $C_{1-1}$. A second electrode of the capacitor $C_{1-1}$ is connected to an inverting input terminal (−) of the comparator $40a_1$. An output of the comparator $40a_1$ is connected to one terminal of the switch circuit $47_1$.

Furthermore, the output of the comparator $40a_1$ is connected to a connection point between the capacitor $C_{1-1}$ and the inverting input terminal (−) of the comparator $40a_1$ via a switch circuit 431.

Similarly, a voltage signal $V_{pd2}$ output from the other one of the two light receiving circuits 31 sharing the comparator 41a is applied to a first electrode of a capacitor $C_{1-2}$. A second electrode of the capacitor $C_{1-2}$ is connected to an inverting input terminal (−) of the comparator $40a_2$. An output of the comparator $40a_2$ is connected to one terminal of the switch circuit $47_2$. Furthermore, the output of the comparator $40a_2$ is connected to a connection point between the capacitor $C_{1-2}$ and the inverting input terminal (−) of the comparator $40a_2$ via a switch circuit 432.

Note that, in the third embodiment as well, similarly to the first embodiment described above, the comparators $40a_1$ and $40a_2$ are configured to gently perform threshold determination based on the threshold voltage $Vb_{A0}$ with respect to the signals $V_{diff1}$ and $V_{diff2}$ input to the inverting input terminals (−) as compared with the threshold determination in the comparator 41a.

The other terminal of each of the switch circuits $47_1$ and $47_2$ is connected to an inverting input terminal (−) of the comparator 41a. A threshold voltage $Vb_{A1}$ is applied to a non-inverting input terminal (+) of the comparator 41a.

The switch circuits $47_1$ and $47_2$ are controlled between a conductive state and a non-conductive state in an exclusive manner. When the switch circuit $47_1$ is in the conductive state, a signal $V_{comp1-1}$ output from the comparator $40a_1$ is input to the inverting input terminal (−) of the comparator 41a via the switch circuit $47_1$. The comparator 41a compares the signal $V_{comp1-1}$ input to the inverting input terminal (−) with the threshold voltage $Vb_{A1}$ input to the non-inverting input terminal (+), and outputs a signal $V_{comp2-1}$ to the memory 341 as a comparison result.

Similarly, when the switch circuit $47_2$ is in the conductive state, a signal $V_{comp1-2}$ output from the comparator $40a_2$ is input to the inverting input terminal (−) of the comparator 41a via the switch circuit $47_2$. The comparator 41a compares the signal $V_{comp1-2}$ input to the inverting input terminal (−) with a threshold voltage $Vb_{A2}$ input to the non-inverting input terminal (+), and outputs a signal $V_{comp2-2}$ to the memory 341 as a comparison result.

As described above, in the third embodiment, by making the threshold voltage $Vb_{A0}$ variable for the plurality of comparators $40a_1$ and $40a_2$ sharing the output-side comparator 41a, the gains of the comparators $40a_1$ and $40a_2$ can be decreased, and accordingly, contrast sensitivity can be lowered. For example, it may be considered to change each of the voltages $Vb_{on}$ and $Vb_{off}$ applied to the comparators $40a_{1-1}$ and $40a_{1-2}$ such that the absolute value of the difference of the voltage $Vb_{on}$ or $Vb_{off}$ from the voltage $V_{az}$ becomes a normal value for use in an environment with a normal or small light amount, and the absolute value of the difference of the voltage $Vb_{on}$ or $Vb_{off}$ from the voltage $V_{az}$ becomes an increased value for use in an environment with a large light amount.

Furthermore, according to the third embodiment, since the plurality of input-side comparators share one output-side comparator, a pixel size can be reduced.

6. Fourth Embodiment

Next, a fourth embodiment of the present disclosure will be described. The fourth embodiment is an example in which one input-side comparator is shared by a plurality of output-side comparators in each detection block 32.

Figure 17:
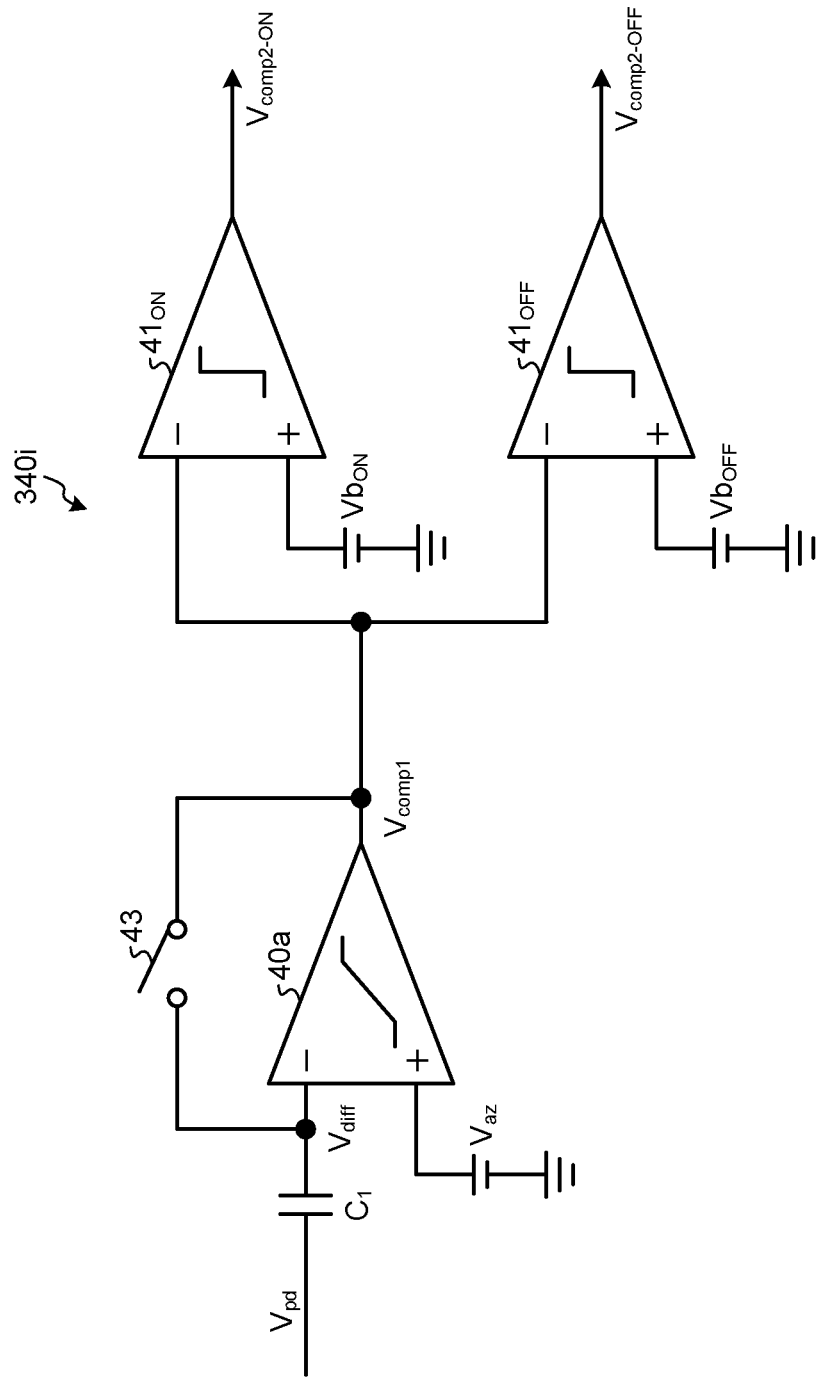
FIG. 17 is a diagram illustrating an example of a configuration of a detection unit according to a fourth embodiment.

FIG. 17 is a diagram illustrating an example of a configuration of a detection unit 340i according to the fourth embodiment. In the example of FIG. 17, the input-side comparator 40a is shared by two output-side comparators $41a_{ON}$ and $41a_{OFF}$. The present disclosure is not limited to this example, and one input-side comparator 40a can be shared by three or more output-side comparators 41.

In FIG. 17 the same circuit can be applied for the comparator 40a as the comparator 40a described, for example, with reference to FIG. 8B. A voltage signal $V_{pd}$ is applied to the first electrode of the capacitor $C_1$. A second electrode of the capacitor $C_1$ is connected to an inverting input terminal (−) of the comparator 40a. An output of the comparator 40a is connected to a connection point between the first electrode of the capacitor $C_1$ and the inverting input terminal (−) of the comparator 40a via the switch circuit 43. A voltage $V_{az}$ is applied to the non-inverting input terminal (+) of the comparator 40a.

Note that, in the fourth embodiment as well, similarly to the first embodiment described above, the comparator 40a is configured to gently perform threshold determination based on the threshold voltage $Vb_{40}$ with respect to the signal $V_{diff}$ input to the inverting input terminal (−) as compared with the threshold determination in the comparators $41_{ON}$ and $41_{OFF}$.

A signal $V_{comp1}$ output from the comparator 40a is input to the inverting input terminal (−) of each of the comparators $40_{ON}$ and $40_{OFF}$. Here, a variable voltage $Vb_{on}$ is applied as a threshold voltage to the non-inverting input terminal (+) of the comparator $40_{ON}$. On the other hand, a variable voltage $Vb_{off}$ is applied as a threshold voltage to the non-inverting input terminal (+) of the comparator $40_{OFF}$. That is, the comparator $41_{ON}$ detects a (+) event on the basis of the signal $V_{comp1}$. Furthermore, the comparator $41_{OFF}$ detects a (−) event on the basis of the signal $V_{comp1}$.

The comparator $41_{ON}$ outputs a result obtained by comparing the signal $V_{comp1}$ input to the inverting input terminal (−) with the voltage $Vb_{on}$ applied to the non-inverting input terminal (+) as a signal $V_{comp2\text{-}ON}$. In addition, the comparator $41_{OFF}$ outputs a result obtained by comparing the signal $V_{comp1}$ input to the inverting input terminal (−) and the voltage $Vb_{off}$ applied to the non-inverting input terminal (+) as a signal $V_{comp2\text{-}OFF}$. These signals $V_{comp2\text{-}ON}$ and $V_{comp2\text{-}OFF}$ are stored in the memory 341.

As described above, in the fourth embodiment, by making the threshold voltages $Vb_{on}$ and $Vb_{off}$ variable for the plurality of output-side comparators $40_{ON}$ and $40_{OFF}$ shared by the input-side comparator 40a, the gain of the comparator 40a can be relatively decreased, and accordingly, contrast sensitivity can be lowered. For example, it may be considered to change each of the voltages $Vb_{on}$ and $Vb_{off}$ applied to the comparators $41_{ON}$ and $41_{OFF}$ such that the absolute value of the difference of the voltage $Vb_{on}$ or $Vb_{off}$ from the voltage $V_{az}$ becomes a normal value for use in an environment with a normal or small light amount, and the absolute value of the difference of the voltage $Vb_{on}$ or $Vb_{off}$ from the voltage $V_{az}$ becomes a decreased value for use in an environment with a large light amount.

Furthermore, according to the fourth embodiment, in a case where a (+) event and a (−) event are detected by the plurality of output-side comparators, respectively, since one input-side comparator is shared by the plurality of output-side comparators, a pixel size can be reduced.

7. Fifth Embodiment (7-1. Example of Application of Technology According to Present Disclosure)

Figure 18:
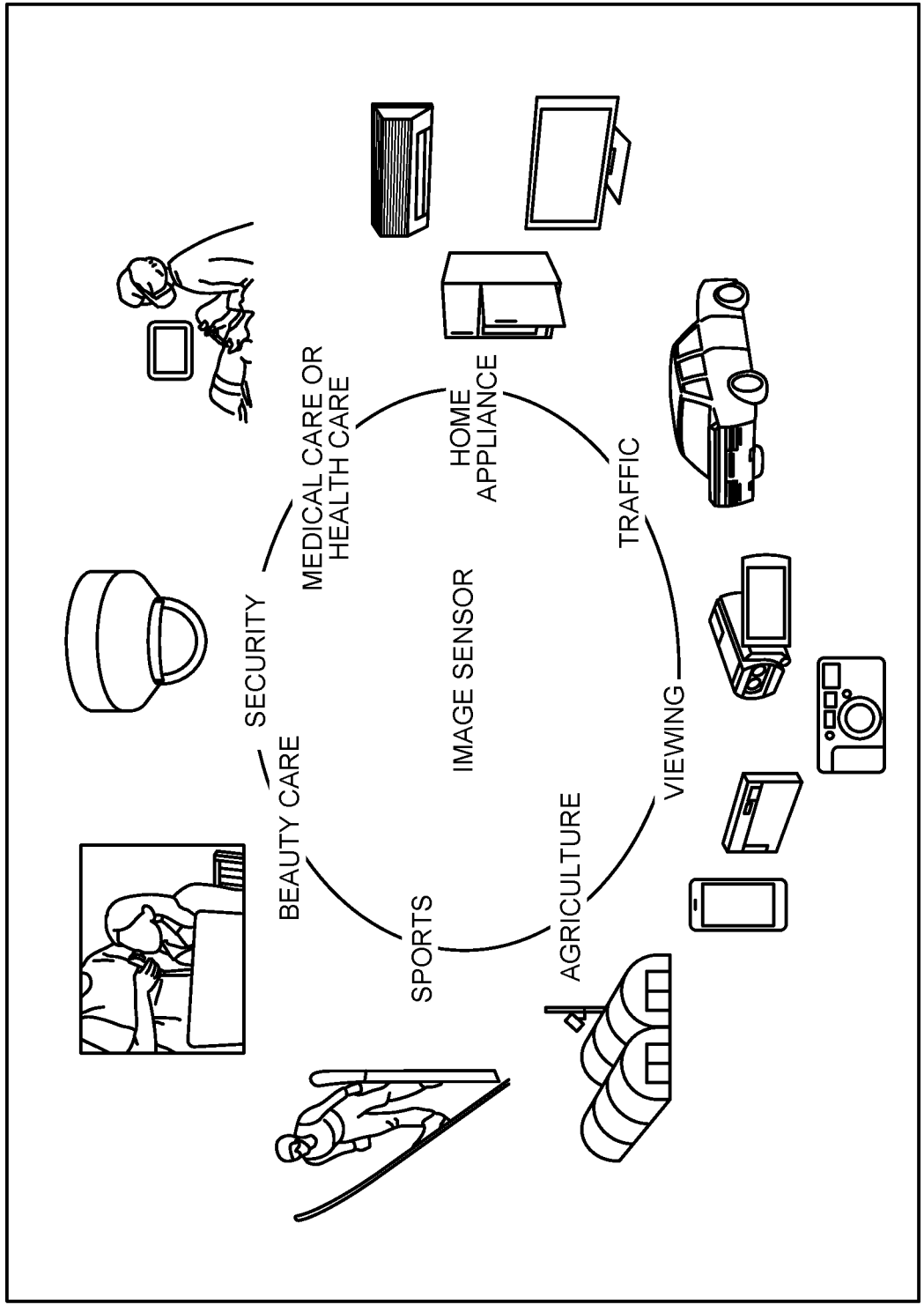
FIG. 18 is a diagram illustrating examples in which imaging devices according to the first embodiment and the modifications thereof, the second embodiment and the modification thereof, the third embodiment, and the fourth embodiment are used.

Next, as a fifth embodiment, examples of application of imaging devices 100 as an electronic apparatuses according to the first embodiment and the modifications thereof, the second embodiment and the modification thereof, the third embodiment, and the fourth embodiment of the present disclosure will be described. FIG. 18 is a diagram illustrating examples in which the imaging devices 100 according to the first embodiment and the modifications thereof, the second embodiment and the modification thereof, the third embodiment, and the fourth embodiment are used.

The above-described imaging devices 100 can be used in various cases where light such as visible light, infrared light, ultraviolet light, or X-rays is sensed and recognition processing is performed on the basis of a sensing result, for example, as will be described below.

A device capturing images to be used for viewing, such as a digital camera or a portable device having a camera function.

A device used for traffic, such as an in-vehicle sensor imaging the front, the rear, the surroundings, the inside, and the like of an automobile for safe driving, such as automatic stop, recognition of a driver's condition, or the like, a monitoring camera monitoring traveling vehicles and roads, or a distance measurement sensor measuring a distance between vehicles and the like.

A device used for a home appliance, such as a TV, a refrigerator, or an air conditioner, to image a user's gesture and operate the appliance according to the gesture.

A device used for medical care or health care, such as an endoscope or a device performing angiography by receiving infrared light.

A device used for security, such as a monitoring camera for crime prevention or a camera for person authentication.

A device used for beauty care, such as a skin measurement instrument for imaging a skin or a microscope for imaging a scalp.

A device used for sports, such as an action camera or a wearable camera for sports or the like.

A device used for agriculture, such as a camera for monitoring a condition of a farm or a crop.

(7-2. Example of Application to Mobile Body)

The technology according to the present disclosure (the present technology) can be applied to various products. For example, the technology according to the present disclosure may be realized as a device mounted on any type of mobile body, such as an automobile, an electric vehicle, a hybrid electric vehicle, a motorcycle, a bicycle, a personal mobility, an airplane, a drone, a ship, or a robot.

Figure 19:
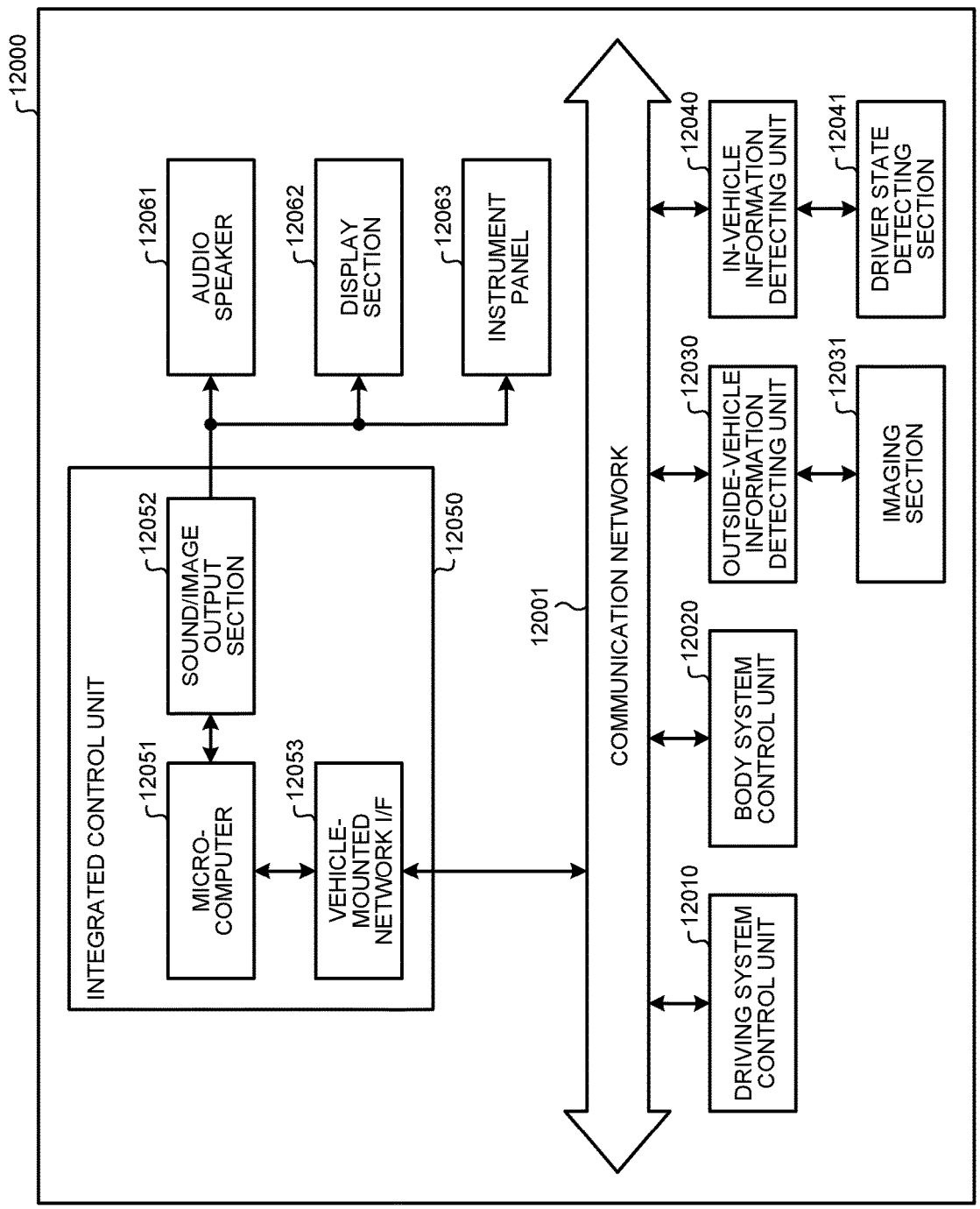
FIG. 19 is a block diagram depicting an example of schematic configuration of a vehicle control system as an example of a mobile body control system to which the technology according to an embodiment of the present disclosure can be applied.

FIG. 19 is a block diagram depicting an example of schematic configuration of a vehicle control system as an example of a mobile body control system to which the technology according to an embodiment of the present disclosure can be applied.

a vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 19, an audio speaker 12061, a display section 12062, and an instrument panel 12063 are illustrated as the output device. The display section 12062 may, for example, include at least one of an on-board display and a head-up display.

Figure 20:
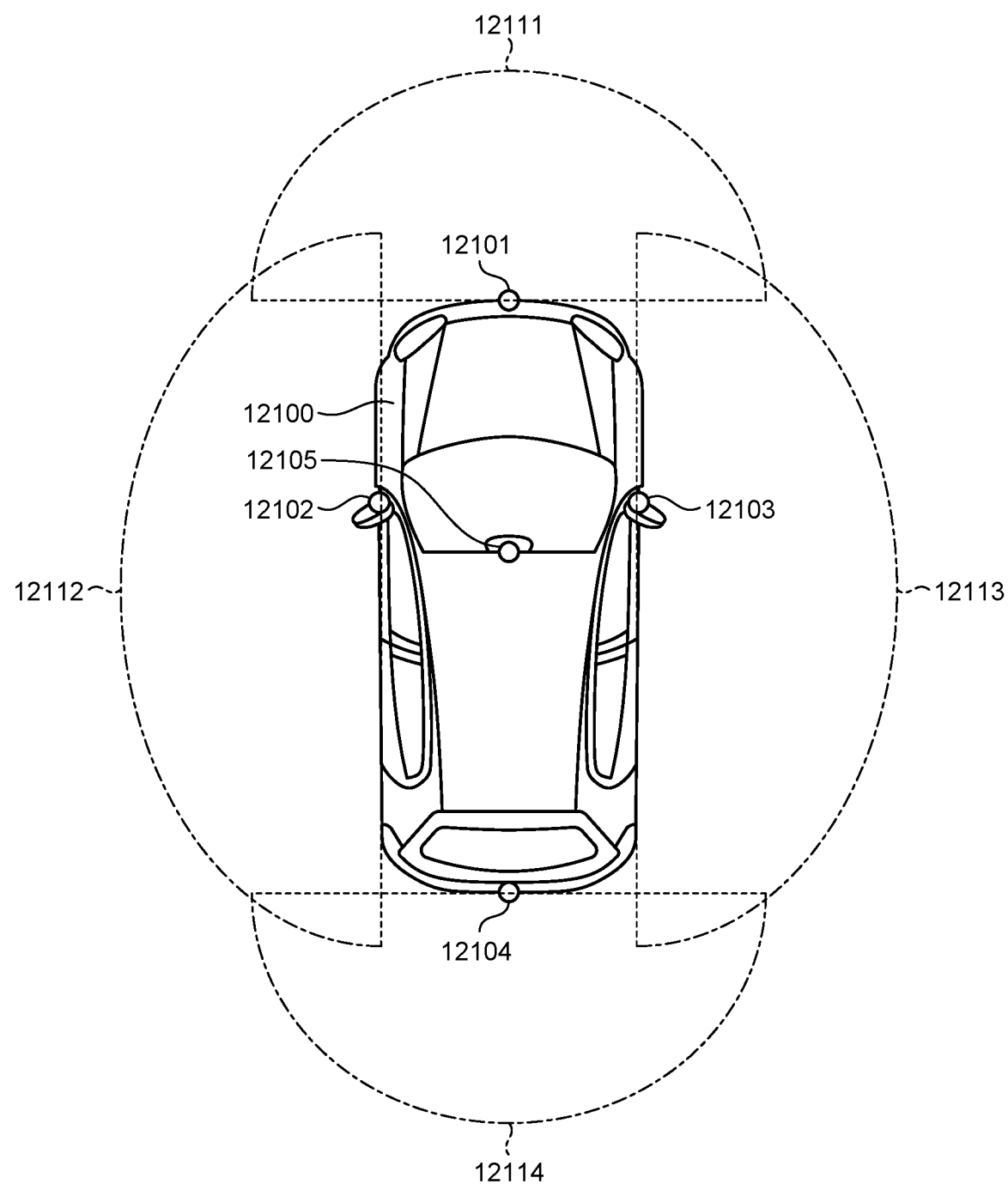
FIG. 20 is a diagram depicting an example of an installation position of an imaging section.

FIG. 20 is a diagram depicting an example of the installation position of the imaging section 12031.

In FIG. 20, a vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. Forward images obtained by the imaging sections 12101 and 12105 are used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 and the outside-vehicle information detecting unit 12030 among the above-described components.

As described above, by applying the technology according to the present disclosure to the imaging section 12031 and the outside-vehicle information detecting unit 12030, imaging can be appropriately executed even in an environment with a large amount of light.

Note that the effects described in the present specification are merely exemplary and are not restrictive, and there may be other effects as well.

Note that the present technology can also take the following configurations.

(1) A solid-state imaging device comprising
   pixel circuits, each of the pixel circuits including:
      a generation unit generating a voltage corresponding to a logarithmic value of a photocurrent;
      a capacitor having a first electrode to which the voltage generated by the generation unit is applied;
      a first amplifier having a first input terminal, which is connected to a second electrode of the capacitor, and a second input terminal, to which a first reference voltage is applied to, to output a comparison result obtained by comparing the voltage applied to the first input terminal with the voltage applied to the second input terminal;
      a switch unit controlling a connection between the output of the first amplifier and the first input terminal; and
      a second amplifier having a third input terminal, to which the output of the first amplifier is connected, and a fourth input terminal, to which a second reference voltage is applied, to output a comparison result obtained by comparing the voltage applied to the third input terminal with the voltage applied to the fourth input terminal, wherein
      a first gain of the first amplifier is lower than a second gain of the second amplifier.
(2) The solid-state imaging device according to the above (1), wherein
   the first amplifier includes a first gain change unit changing the first gain.
(3) The solid-state imaging device according to the above (2), wherein
   the first gain change unit changes the first gain by changing the first reference voltage.
(4) The solid-state imaging device according to the above (2), wherein
   the first gain change unit changes the first gain by changing elements constituting the first amplifier.
(5) The solid-state imaging device according to the above (4), wherein
   the elements are transistors to which the voltage is applied from the first input terminal of the first amplifier, and
   the first gain change unit changes the first gain by changing the number of connections between the transistors connected to each other in parallel.
(6) The solid-state imaging device according to the above (4), wherein
   the elements are capacitors for applying negative feedback to the first amplifier, and
   the first gain change unit changes the first gain by changing a capacitance generated by each of the capacitors.
(7) The solid-state imaging device according to the above (4), wherein
   the elements are resistors for applying negative feedback to the first amplifier, and
   the first gain change unit changes the first gain by changing a resistance value generated by each of the resistors.

(8) The solid-state imaging device according to the above (1), wherein
the second amplifier includes a second gain change unit changing the second gain.
(9) The solid-state imaging device according to the above (8), wherein
the second gain change unit changes the second gain by changing the second reference voltage.
(10) The solid-state imaging device according to the above (8), wherein
the second gain change unit changes the second gain by changing elements constituting the second amplifier.
(11) The solid-state imaging device according to the above (10), wherein
the elements are transistors to which the voltage is applied from the third input terminal of the second amplifier, and
the second gain change unit changes the second gain by changing the number of connections between the transistors connected to each other in parallel.
(12) The solid-state imaging device according to any one of the above (1) to (11), wherein
the pixel circuits are arranged in a matrix array to constitute a pixel array, and
the second amplifier is shared by two or more pixel circuits among the pixel circuits included in the pixel array.
(13) The solid-state imaging device according to any one of the above (1) to (11), wherein
the first amplifier is shared by two or more second amplifiers.
(14) An imaging method comprising:
applying a voltage generated according to a logarithmic value of a photocurrent to a first electrode of a capacitor;
outputting a comparison result, by a first amplifier having a first input terminal, which is connected to a second electrode of the capacitor, and a second input terminal, to which a first reference voltage is applied, while a connection between the output of the first amplifier and the first input terminal is controlled by a switch unit, the comparison result of the first amplifier being obtained by comparing the voltage applied to the first input terminal with the voltage applied to the second input terminal; and
outputting a comparison result, by a second amplifier having a third input terminal, to which the output of the first amplifier is connected, and a fourth input terminal, to which a second reference voltage is applied, the comparison result of the second amplifier being obtained by comparing the voltage applied to the third input terminal with the voltage applied to the fourth input terminal, wherein
a first gain of the first amplifier is lower than a second gain of the second amplifier.
(15) An electronic apparatus comprising:
pixel circuits, each of the pixel circuits including
a generation unit generating a voltage corresponding to a logarithmic value of a photocurrent,
a capacitor having a first electrode to which the voltage generated by the generation unit is applied,
a first amplifier having a first input terminal, which is connected to a second electrode of the capacitor, and a second input terminal, to which a first reference voltage is applied, to output a first comparison result obtained by comparing the voltage applied to the first input terminal with the voltage applied to the second input terminal,
a switch unit controlling a connection between the output of the first amplifier and the first input terminal, and
a second amplifier having a third input terminal, to which the output of the first amplifier is connected, and a fourth input terminal, to which a second reference voltage is applied, to output a second comparison result obtained by comparing the voltage applied to the third input terminal with the voltage applied to the fourth input terminal; and
a recording unit that records a signal on the basis of the second comparison result, wherein
a gain of the first amplifier is lower than a gain of the second amplifier.

REFERENCE SIGNS LIST

31 LIGHT RECEIVING CIRCUIT
32 DETECTION BLOCK
34 DETECTION CIRCUIT
40a, $40a_1$, $40a_2$, 40b, 41a, 41b, $41_{ON}$, $41_{OFF}$, 3400 COMPARATOR 42, 43, 44, 45, 46, $47_1$, $47_2$ SWITCH CIRCUIT
340, 340a, 340b, 340c, 340d, 340e, 340f, 340g, 340h, 340i DETECTION UNIT
341 MEMORY
401, 402, 403, 404, 411, 412, 413, 414, 415, 416 TRANSISTOR

The invention claimed is:
1. A solid-state imaging device, comprising
pixel circuits, each of the pixel circuits including:
a generation unit generating a voltage corresponding to a logarithmic value of a photocurrent;
a capacitor having a first electrode to which the voltage generated by the generation unit is applied;
a first amplifier having a first input terminal, which is connected to a second electrode of the capacitor, and a second input terminal, to which a first reference voltage is applied to, to output a comparison result obtained by comparing the voltage applied to the first input terminal with the voltage applied to the second input terminal;
a switch unit controlling a connection between the output of the first amplifier and the first input terminal; and
a second amplifier having a third input terminal, to which the output of the first amplifier is connected, and a fourth input terminal, to which a second reference voltage is applied, to output a comparison result obtained by comparing the voltage applied to the third input terminal with the voltage applied to the fourth input terminal, wherein
a first gain of the first amplifier is lower than a second gain of the second amplifier.
2. The solid-state imaging device according to claim 1, wherein
the first amplifier includes a first gain change unit changing the first gain.
3. The solid-state imaging device according to claim 2, wherein
the first gain change unit changes the first gain by changing the first reference voltage.
4. The solid-state imaging device according to claim 2, wherein
the first gain change unit changes the first gain by changing elements constituting the first amplifier.

5. The solid-state imaging device according to claim 4, wherein
the elements are transistors to which the voltage is applied from the first input terminal of the first amplifier, and
the first gain change unit changes the first gain by changing a number of connections between the transistors connected to each other in parallel.

6. The solid-state imaging device according to claim 4, wherein
the elements are a plurality of capacitors to apply negative feedback to the first amplifier, and
the first gain change unit changes the first gain by changing a capacitance generated by each of the plurality of capacitors.

7. The solid-state imaging device according to claim 4, wherein
the elements are a plurality of resistors to apply negative feedback to the first amplifier, and
the first gain change unit changes the first gain by changing a resistance value generated by each of the plurality of resistors.

8. The solid-state imaging device according to claim 1, wherein
the second amplifier includes a second gain change unit changing the second gain.

9. The solid-state imaging device according to claim 8, wherein
the second gain change unit changes the second gain by changing the second reference voltage.

10. The solid-state imaging device according to claim 8, wherein
the second gain change unit changes the second gain by changing elements constituting the second amplifier.

11. The solid-state imaging device according to claim 10, wherein
the elements are transistors to which the voltage is applied from the third input terminal of the second amplifier, and
the second gain change unit changes the second gain by changing a number of connections between the transistors connected to each other in parallel.

12. The solid-state imaging device according to claim 1, wherein
the pixel circuits are arranged in a matrix array to constitute a pixel array, and
the second amplifier is shared by two or more pixel circuits among the pixel circuits included in the pixel array.

13. The solid-state imaging device according to claim 1, wherein
the first amplifier is shared by two or more second amplifiers.

14. An imaging method, comprising:
applying a voltage generated according to a logarithmic value of a photocurrent to a first electrode of a capacitor;
outputting a comparison result, by a first amplifier having a first input terminal, which is connected to a second electrode of the capacitor, and a second input terminal, to which a first reference voltage is applied, while a connection between the output of the first amplifier and the first input terminal is controlled by a switch unit, the comparison result of the first amplifier being obtained by comparing the voltage applied to the first input terminal with the voltage applied to the second input terminal; and
outputting a comparison result, by a second amplifier having a third input terminal, to which the output of the first amplifier is connected, and a fourth input terminal, to which a second reference voltage is applied, the comparison result of the second amplifier being obtained by comparing the voltage applied to the third input terminal with the voltage applied to the fourth input terminal, wherein
a first gain of the first amplifier is lower than a second gain of the second amplifier.

15. An electronic apparatus, comprising:
pixel circuits, each of the pixel circuits including
a generation unit generating a voltage corresponding to a logarithmic value of a photocurrent,
a capacitor having a first electrode to which the voltage generated by the generation unit is applied,
a first amplifier having a first input terminal, which is connected to a second electrode of the capacitor, and a second input terminal, to which a first reference voltage is applied, to output a first comparison result obtained by comparing the voltage applied to the first input terminal with the voltage applied to the second input terminal,
a switch unit controlling a connection between the output of the first amplifier and the first input terminal, and
a second amplifier having a third input terminal, to which the output of the first amplifier is connected, and a fourth input terminal, to which a second reference voltage is applied, to output a second comparison result obtained by comparing the voltage applied to the third input terminal with the voltage applied to the fourth input terminal; and
a recording unit that records a signal on the basis of the second comparison result, wherein
a gain of the first amplifier is lower than a gain of the second amplifier.

* * * * *